(12) United States Patent
Akiyama et al.

(10) Patent No.: US 6,872,966 B2
(45) Date of Patent: Mar. 29, 2005

(54) OPTICAL SEMICONDUCTOR DEVICE

(75) Inventors: Suguru Akiyama, Kawasaki (JP); Haruhisa Soda, Hachioji (JP); Shigeaki Sekiguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/620,423

(22) Filed: Jul. 17, 2003

(65) Prior Publication Data

US 2004/0016920 A1 Jan. 29, 2004

(30) Foreign Application Priority Data

Jul. 18, 2002 (JP) ........................................ 2002-209761

(51) Int. Cl.[7] .............................................. H01L 29/06
(52) U.S. Cl. .............................. 257/14; 257/89; 257/92; 257/88; 257/12; 257/192; 257/194; 257/195
(58) Field of Search ................................. 257/432, 433, 257/435, 429, 436; 385/2, 3, 4, 12, 13, 14

(56) References Cited

U.S. PATENT DOCUMENTS

| | | | |
|---|---|---|---|
| 5,675,673 A | * | 10/1997 | Skeie .............................. 385/2 |
| 5,815,610 A | * | 9/1998 | Tokano et al. .................. 385/2 |
| 6,122,414 A | * | 9/2000 | Shimizu ......................... 385/2 |
| 6,334,008 B2 | * | 12/2001 | Nakabayashi ................. 385/14 |

OTHER PUBLICATIONS

L. Mörl et al.; "A Travelling Wave Electrode Mach–Zehnder 40 Gb/s Demultiplexer Based on Strain Compensated GaInAs/AlInAs Tunnelling Barrier MQW Structure"; *10th Intern. Conf. on Indium Phosphide and Related Materials* WA3–4; May 11–15, 1998; pp. 403–406.

* cited by examiner

*Primary Examiner*—Nathan J. Flynn
*Assistant Examiner*—Fazli Erdem
(74) *Attorney, Agent, or Firm*—Armstrong, Kratz, Quintos, Hanson & Brooks, LLP

(57) ABSTRACT

There are provided first and second optical waveguides formed on a semiconductor substrate and having upper clad layers and core layers that are separated mutually respectively, first and second phase modulation electrodes formed on the first and second optical waveguides respectively, and first and second slot-line electrodes formed on the semiconductor substrate on both sides of the first and second optical waveguides and connected to the first and second phase modulation electrodes via air-bridge wirings separately respectively.

36 Claims, 35 Drawing Sheets

OPTICAL SEMICONDUCTOR DEVICE

CROSS-REFERENCE TO RELATED APPLICATIONS

This application is based upon and claims priority of Japanese Patent Application No. 2002-209761, filed on Jul. 18, 2002, the contents being incorporated herein by reference.

BACKGROUND OF THE INVENTION

1. Field of the Invention

The present invention relates to an optical semiconductor device and, more particularly, an optical semiconductor device used as an optical modulator in the optical transmitter in the optical communication system.

2. Description of the Prior Art

In the optical communication system, as the devices used as the optical modulator in the optical transmitter, there are devices having such a structure that has a function of modulating the continuous light based on the waveform of the input electric signal (voltage). Out of them, the device that deals with the very high-speed communication at a communication rate of 10 to 80 Gbits/sec or more is employed.

As the device having such function, the Mach-Zehnder optical modulator using $LiNbO_3$ as the material can be listed. FIG. 1 is a schematic view showing such device viewed from the top.

The optical modulator shown in FIG. 1 has an interferometer including two optical waveguides 101, 102, two optical couplers 103, 104, and one optical phase modulator 105. Input ends of the first and second optical waveguides 101, 102 are connected to the first optical coupler 103 to separate the continuous light into two continuous lights. Also, Output ends of them are connected to the second optical coupler 104 to recombine two separated continuous lights. Thus, the modulated optical signal is generated.

The optical phase modulator 105 is comprised of a signal electrode 105a formed on the first optical waveguide 101, and first and second ground electrode 105b, 105c formed at an interval on both sides of the signal electrode 105a. One ends of the first and second ground electrode 105b, 105c are connected electrically to one end of the signal electrode 105a via a high-frequency electric signal source 106 respectively. Also, the other ends of the first and second ground electrode 105b, 105c are connected electrically to the other end of the signal electrode 105a via a terminating resistance 107 respectively.

A sectional structure of the optical phase modulator 105 in the optical modulator shown in FIG. 1, if viewed along a I—I line, is shown in FIG. 2.

A core 110a of the first optical waveguide 101 is formed by diffusing titanium into a surface layer of a $LiNbO_3$ substrate 100. A core of the second optical waveguide 102, although not particularly shown, has the same structure as the core 101a of the first optical waveguide 101.

The $LiNbO_3$ substrate 100 is covered with a buffer layer 108 made of dielectrics such as $SiO_2$, or the like. The signal electrode 105a and the first and second ground electrodes 105b, 105c are formed on the buffer layer 108 by the gold (Au) plating.

In such structure, when a signal voltage is applied between the signal electrode 105a and the ground electrodes 105b, 105c from the high-frequency electric signal source 106, the electric field generated around the signal electrode 105a is distributed in areas between the signal electrode 105a and the ground electrodes 105b, 105c to have an almost uniform intensity. A part of the electric field is applied to the core 110a of the first optical waveguide 101 to cause change in the refractive index.

Normally, the cross section shown in FIG. 2 is the structure that is designed as the traveling-wave electrode structure. The reflection from the device, to which the high-frequency electric signal is applied, to the driver circuit is suppressed by matching the characteristic impedance into 50 Ω. Normally, a length of the device that uses $LiNbO_3$-based material as the material of the modulator (optical modulator length) becomes very large like about 40 mm.

Meanwhile, the optical modulator using the semiconductor as the device material is also established. A length of the device using the semiconductor material becomes several mm at its maximum, and is smaller than the device using $LiNbO_3$ as the material. Also, if the semiconductor is used as the substrate material, the optical modulator can be integrated together with the light source using the semiconductor as the material, e.g., the laser diode.

Schematic configurative views of the Mach-Zehnder optical modulator using the semiconductor as the material in the prior art are shown in FIG. 3 to FIG. 5. FIG. 4 is a sectional view taken along a II—II line in FIG. 3, and FIG. 5 is a sectional view taken along a III—III line in FIG. 3. Such optical modulator is set forth in 10th International Conference on Indium Phosphide and Related Materials WA3-4 (1998), for example.

In such optical modulator, like the above optical modulator made of $LiNbO_3$-based material, the traveling-wave electrode is formed in the portion into which the electric signal is input.

The optical modulator shown in FIG. 3 has two ridge-type optical waveguides 111, 112, two optical couplers 113, 114, and a traveling-wave electrode 115. A structure of the traveling-wave electrode 115 shown in FIG. 3 is called a capacitive-load/slot-line type electrode structure hereinafter.

The traveling-wave electrode 115 is roughly divided into two kinds of areas. One area out of these areas is shown as two slot-line electrodes 115a, 115b that are arranged at an interval on both sides of the optical waveguides 111, 112 and have a large width. A high-frequency electric signal source 116 is connected to one ends of the first slot-line electrode 115a and the second slot-line electrode 115b. The other ends of them are connected together via a terminating resistance 131.

These two slot-line electrodes 115a, 115b constitute the slot-line type transmission line if narrow electrode portions that are derived on the inside of them are omitted from consideration. This slot-line type transmission line functions as the transmission line that propagates the signal, which is supplied from the high-frequency electric signal source 116 connected to the device end, to the entire device.

The other area is phase modulation electrodes 115c, 115d of the phase modulator portion that are formed in an area between two slot-line electrodes 115a, 115b. The phase modulation electrodes 115c, 115d are formed over two ridge-type optical waveguides (arms) 111, 112 constituting the Mach-Zehnder interferometer, and are formed to apply the electric field to the core layer of the optical waveguide in the arms 111, 112.

The phase modulation electrodes 115c, 115d can be regarded electrically as the capacitance (electric capacitance), as described later. Then, the electric capacitances are connected to the slot-line electrodes 115a, 115b via the bridge wirings. Therefore, the overall structure of the traveling-wave electrode 115a, 115b shown in FIG. 3 is called the capacitive-load slot-line electrode structure.

The reason why the traveling-wave electrode 115 is divided into two areas in this manner is that the characteristic impedance is caused to coincide with a desired value by regarding the entirety of them as one high-frequency transmission line.

FIG. 4 is a II—II line sectional view of the phase modulator portion and its periphery in the semiconductor optical modulator shown in FIG. 3.

In FIG. 4, a high-resistance InP buffer layer 121, a first InGaAsP etch-stop layer 122, an n$^+$-InP layer 123, an n$^-$-InP layer 124, a MQW layer 125, a first i-InP layer 126, a second InGaAsP etch-stop layer 127, a second i-InP layer 128, a p-InP layer 129, and a p-InGaAsP contact layer 130 are formed sequentially on a high-resistance InP substrate 120. Then, respective layers from the first InGaAsP etch-stop layer 122 to the second InGaAsP etch-stop layer 127 are patterned into a shape that includes the first and second optical waveguides 111, 112 therein, and are left on the InP substrate 120.

Also, the second i-InP layer 128, the p-InP layer 129, and the p-InGaAsP contact layer 130 are formed as first and second ridge portions 111a, 112a along the first and second optical waveguides 111, 112. Then, the first optical waveguide 111 is constructed by the first ridge portion 111a and respective lower layers. Also the second optical waveguide 112 is constructed by the second ridge portion 112a and respective lower layers.

Multi-layered structures each constructed by laminating the high-resistance InP buffer layer 121, the first InGaAsP etch-stop layer 122, the n$^+$-InP layer 123, the n$^-$-InP layer 124, the MQW layer 125, the first i-InP layer 126, the second InGaAsP etch-stop layer 127, and a third i-InP layer 135 are formed in the slot-line areas on both sides of the area, which includes the first and second optical waveguides 111, 112, away from the layers constituting the first and second optical waveguides 111, 112. The slot-line electrodes 115a, 115b are formed on the third i-InP layers 135 of two multi-layered structures respectively. Also, the phase modulation electrodes 115c, 115d are formed on the p-InGaAsP contact layers 130 of the first and second ridge portions 111a, 112a respectively.

The first phase modulation electrode 115c formed intermittently at an interval on the first ridge portion 111a is connected to the first slot-line electrode 115a via an air-bridge wiring 115e. Also, the second phase modulation electrode 115d formed intermittently at an interval on the second ridge portion 112a is connected to the second slot-line electrode 115b via an air-bridge wiring 115f. In this case, a DC pad 115g is formed on the second InGaAsP etch-stop layer 127.

A sectional structure in FIG. 4 is formed to put the MQW layer 125, which is the core layer of the very thin optical waveguide, between conductive semiconductor layers vertically, and has a large electric capacitance per unit length.

The characteristic impedance of the uniform transmission line constructed by such a layer structure, which has the large electric capacitance per unit length, becomes a vary small value. Therefore, such characteristic impedance is largely deviated from a desired value, e.g., 50 Ω.

In contrast, the characteristic impedance of the slot-line portion only has a relatively large value because an interval between two slot-line electrodes 115a, 115b constituting them is large. Such value can be brought close to a desired value to some extent by adjusting the interval between two slot-line electrodes 115a, 115b.

Here, the characteristic impedance obtained when the overall device with the addition of such phase modulation area and the slot-line area is regarded as the transmission line of the millimeter wave is derived as an average value of the characteristic impedance of the slot-line area and the characteristic impedance of the phase modulation area.

As a result, though the structures of the phase modulator portions are still maintained as the layer structure having the large electric capacitance in FIG. 4, the characteristic impedance of the overall device can be designed to come close to the desired value by adjusting the structures of the slot-line electrodes 115a, 115b that are combined with the structures of the phase modulator portions. Otherwise, the characteristic impedance of the overall device can be adjusted by adjusting an occupied rate of a total length of the phase modulation electrodes 115c, 115d to a total length of the slot-line electrodes 115a, 115b.

Also, in the sectional structure in FIG. 4, two optical waveguides 111, 112 constituting the Mach-Zehnder interferometer are formed as the ridge-type optical waveguide, and consists of the MQW layer 125.

Because of the ridge-type optical waveguide, the MQW layer 125 as the core layer spreads laterally. In this optical modulator, the MQW layer 125 is continuous between two arms. The n-InP layers 123, 124 are formed uniformly directly under or below the MQW layer 125, and widths of these n-InP layers are identical to the MQW layer 125 and are formed continuously between two arms. Also, the layer provided directly on the MQW layer 125 is formed by the first i-InP layer 126, and this first i-InP layer 126 is spread to have the same width as the MQW layer 125. The ridge portions 111a, 112a provided over the first i-InP layer 126 are formed by the second i-InP layer 128 and the p-InP layer 129 in order of nearing to the MQW layer 125 respectively. These widths are almost 2.0 µm like the normal optical waveguide.

FIG. 5 is a sectional view taken along a III—III line in FIG. 3 and showing the phase modulator in the direction parallel with the optical axis of the phase modulator.

As shown in FIG. 5, the phase modulation electrodes 115c, 115d by which the electric field is applied to the MQW layer 125 to execute the phase modulation are intermittently formed over two arms constituting the Mach-Zehnder interferometer along the axial direction the arms. Also, the p-InP layer 129 made of the conductive semiconductor and the p-InGaAsP contact layer 130 are formed directly on the MQW layer 125 in the areas of the arms in which the phase modulation electrodes 115c, 115d are not formed.

In the optical modulator in the prior art, there is such a problem that an energy loss generated when the high-frequency electric signal is caused to propagate to the traveling-wave electrode on the device at the time of optically modulating operation becomes large. As a result, there is caused such a problem that a frequency band used when the high-frequency electric signal propagates through the traveling-wave electrode of the device becomes low, and thus the optical modulation band is suppressed low.

In the optical modulator in the prior art, a loss factor generated when the high-frequency electric signal propagates through the traveling-wave electrode on the device becomes α=200 to 250/m. In this case, an intensity of the high-frequency electric signal, which propagates through the traveling-wave electrode having a length L m, attenuates at the rate of exp(−αL). Four causes for such large loss of the high-frequency electric signal as above are considered. These causes will be discussed in detail sequentially hereunder.

First, the first cause will be explained hereunder.

In the sectional layer structure of the optical modulator shown in FIG. 4 in the prior art, the p-InP layers 129 is formed on or over the undoped i-MQW layer 125 and the i-InP layers 126, 128. If such layer structure is formed by the epitaxial growth by virtue of the MOVPE method, Zn acting as the dopant of the p-InP layers 129 is diffused into the lower i-InP layers 126, 128 and into the i-MQW layer 125 to change a part of these i-type layers into the p-type conductivity.

In FIG. 4, the i-InP layer 126 and the i-MQW layer 125 are formed continuously between two arms.

Accordingly, if these layers are changed to have the p-type conductivity, respective phase modulation electrodes 115c, 115d on two arms are connected electrically to each other via the lower p-InP layers 129 and the p-InGaAs layers 130, and these i-type semiconductor layers whose conductivity is changed into the p-type conductivity. Normally, if electrical isolation between two electrodes through which the high-frequency electric signal propagates is incomplete, the loss of the high-frequency electric signal that is caused to propagate between the electrodes is increased. As a result, there is such a problem that the frequency band used when the high-frequency electric signal propagates through the device becomes small and thus the optical modulation band is suppressed small.

It is possible to take such a measure that the diffusion of Zn should be suppressed by forming the i-InP layers 126, 128 formed immediately on or over the MQW layer 125 sufficiently thick. In this case, thicknesses of the i-type layers including the MQW layer 125 become large. If the thicknesses of the i-type layers are increased, the electric field used to modulate the light is applied uniformly to the overall undoped layers and therefore the intensity of the electric field becomes smaller than the case where the overall i-type layers are formed thin. As a result, there is caused such a problem that an increase in a driving voltage is caused.

Then, the second cause will be explained hereunder.

As described above, at the time of modulating operation of the semiconductor optical modulator in the prior art, the high electric field caused by the high-frequency electric signal is applied to concentrate on the i-type layers including the MQW layer 125. Since this electric field exudes into the p-InP layer 129 formed immediately on the i-type layers, such electric field overlaps with the semiconductor that has the electric conductivity in this portion. Such overlapping of the electric field with the conductive material causes the energy loss of the electric signal at the high frequency. This is similarly true of the n-InP layers 123, 124 formed under or below the MQW layer 125. As a result, loss of the high-frequency electric signal is large in the semiconductor optical modulator in the prior art.

Then, the third cause will be explained hereunder.

In FIG. 4, the MQW layer 125 is present continuously between two ridge waveguides. But the electric field, although an amount of such field is minute, is generated by the high-frequency electric signal in the area between two ridge waveguides.

The core consisting of the MQW layer 125 is an undoped layer and is formed as a dielectric layer. In this case, the loss of the high-frequency electric signal is also caused slightly due to the overlapping of the electric field with the MQW layer 125. Also, since a part of the i-MQW layer 125 is changed into the p-type because of the influence of the diffusion of Zn, as described above, a larger loss is caused in this area. These losses act as one of factors of restricting the optical modulation bandwidth.

Then, the fourth cause will be explained hereunder.

As apparent from FIG. 5, the phase modulation electrodes 115c, 115d used to execute the phase modulation by applying the electric field to the MQW layer 125 along the optical axis direction of the arms are formed intermittently in one direction over two arms constituting the Mach-Zehnder interferometer. In this case, the p-InP layer 129 and the p-InGaAsP contact layer 130, which are made of the conductive semiconductor, are also formed directly on the MQW layer 125 in the areas in which the phase modulation electrodes 115c, 115d are not formed on the arms.

In the optical modulating operation, the high-frequency electric signal is transmitted to the phase modulator portion in which the phase modulation electrodes 115c, 115d are formed, and thus the electric field is generated between the phase modulation electrodes 115c, 115d and the n-InP layers 123, 124. At this time, a part of the high-frequency electric signal that transmitted to the phase modulator portions exudes into the axial direction of the arms to generate the electric field in the semiconductor portion in which the phase modulation electrodes 115c, 115d are not provided. Since the exuded electric field overlaps with the semiconductor portion such as the p-InP layer 129, etc., its energy is lost. In other words, such exuded electric field acts as the cause to generate the loss of the high-frequency electric signal and thus acts as the cause to restrict the optical modulation bandwidth, as described up to now.

As described above, in the semiconductor optical modulator in the prior art, the conductive semiconductor layers or the undoped semiconductor layers are formed in various portions on the device. Thus, the loss of the high-frequency electric signal is caused due to the overlapping of these material with the electric field generated by the high-frequency electric signal. As a result, there is such a problem that the optical modulation bandwidth is reduced.

In any case, the cause resides in that the conductive or dielectric semiconductor layers are formed in the areas that are not concerned with the modulation operation. It is desired that the semiconductor layers should be formed at a minimum volume between the metal electrodes in the neighborhood of the MQW core layer in which the phase modulation is executed.

SUMMARY OF THE INVENTION

It is an object of the present invention to provide an optical semiconductor device capable of reducing a loss of an electric signal caused by an overlap of an electric field with a semiconductor rather than the prior art.

The electric signal input portion of the semiconductor modulator in the present invention is formed as the traveling-wave electrode.

The traveling-wave electrode of this modulator is roughly classified into two type areas. One of these areas is two wide slot-line electrodes that are arranged on both sides of the optical semiconductor device. Assume that narrow phase adjusting electrodes that are derived from respective slot-line electrodes to the inside are neglected from the consideration, two slot-line electrodes constitute the slot-line transmission line. The slot-line electrodes have a function as the transmission line through which the high-frequency electric signal propagates to the overall device.

The phase modulation electrodes are formed on the inside of two slot-line electrodes. Each slot-line electrode is formed on two optical waveguides (arms) constituting the Mach-Zehnder interferometer respectively.

In the phase modulation areas of the optical modulator in the present invention, respective core layers of two optical waveguides are formed of MQW, for example. A width of the core layer is suppressed small to the almost same extent as the mode shape of the light in respective arms, and the core layer is not continuously formed between two arms.

The upper clad layer on the core layer is formed of i-InP or p-InP, for example, and a width of the upper clad layer is suppressed small, like the core layer. In addition, the lower clad layer made of the first conductivity type semiconductor, e.g., the n-InP layer, which is present directly under the core layer, is formed in the portion, which comes into contact with the MQW core layer, to have the same width as the MQW core layer.

The outermost surface of the semiconductor layer, e.g., the upper surface of the n-InP layer, in the area that is put between two arms is formed at a position that is lower than the lowermost surface of the core layer.

Also, a high-resistance semiconductor layer is formed on both sides of the core layer. This high-resistance semiconductor layer, the MQW layer, and the upper and lower clad layers constitute a mesa having a width of almost several $\mu$m. The phase modulation electrode is formed to extend over the upper surface of the second conductivity type contact layer formed on the mesa upper surface and the upper surface of the high-resistance semiconductor layer in two arms respectively.

In two arms constituting the Mach-Zehnder interferometer, the conductive semiconductor is formed between the core layer and the phase modulation electrode in the portion in which the phase modulation electrode is formed over the arm, i.e., in the phase modulator portion, whereas the high-resistance semiconductor layer may be formed on the core layer in the portion in which the phase modulation electrode is not formed.

In the present invention, the clad layer made of the first conductivity type semiconductor layer under the optical waveguide is formed wider than the optical waveguide in a part of the area of the device, and the DC bias electrode pad is formed on such extended area. Accordingly, the first conductivity type semiconductor layer under the optical waveguide can be maintained at a constant potential.

In the present invention, it is possible to mate the characteristic impedance of the traveling-wave electrode formed on the device with a desired value. In the present invention, as described above, the traveling electrode on the device is divided into two areas, i.e., the slot-line electrode area and the phase modulation electrode area. Accordingly, if the overall device is regarded as one high-frequency transmission line, the characteristic impedance can be caused to coincide with a desired value.

The phase modulator portion in the present invention has such a structure that the very thin core layer of the optical waveguide is put between the conductive semiconductor layers, and has a large electric capacitance.

The characteristic impedance of two slot-line electrodes has a relatively large value by increasing a mutual interval between two slot-line electrodes. The value can be brought close to a desired value to some extent by adjusting an interval between the electrodes.

The characteristic impedance obtained when the overall device including such two areas is regarded as the transmission line for the millimeter wave becomes an average value of the characteristic impedance of the slot-line electrode area and the characteristic impedance of the phase modulation electrode area. As a result, although the structure of the phase modulator portions is still maintained as the layer structure that has a large electric capacitance, the characteristic impedance of the overall device can be designed to put close to a desired value by adjusting the structure of the slot-line electrodes that are combined with the phase modulator portions. Otherwise, the characteristic impedance of the overall device can be adjusted by adjusting an occupied rate of a length of the phase modulation electrodes to a total length of the slot-line electrodes.

In the present invention, such an advantage can be achieved that the energy loss caused when the high-frequency electric signal propagates over the device becomes small. This advantage will be discussed in detail hereunder.

In the present invention, widths of the i-MQW layer as the core layer and the undoped upper clad layer are suppressed to the same extent as a width of the propagation mode of the light, and also the core layer and the upper clad layer are not continuous between two arms. As a result, even if a part of these layers becomes conductive due to diffusion of the dopant during the crystal growth, the upper clad layers or the core layers are never connected electrically between two arms.

The lower clad layers under respective core layers in two arms are continuous between two arms. However, in each of two arms, the lower clad layers and the electrodes on two arms are connected via the upper clad layers that have the opposite conductivity to the lower clad layers. That is, two diodes each having the opposite polarity are connected in series between the electrodes that are provided to two arms respectively.

Accordingly, the insulating property of the electric paths that pass through the lower clad layers is very high between the electrodes on two arms. In other words, in the optical modulator in the present invention, the electric isolation between two electrodes through which the high-frequency electric signal propagate is excellent, and therefore the loss of the high-frequency electric signal is small.

In the present invention, a width of the MQW layer serving as the core layer of the optical waveguide is suppressed small to the same extent as the mode distribution of light, and the high-resistance semiconductor layer with the refractive index that is smaller than is formed on both sides. In such waveguide structure, a width of the MQW layer is small in contrast to a width of the ridge portion of the ridge-structure waveguide employed in the prior art. Therefore, in the present invention, a width of the p-InP layer (upper clad layer) formed on the MQW layer is small in contrast to a width of the p-InP layer in the prior art. Accordingly, the overlapping of the electric field generated by the high-frequency electric signal with the upper clad layer in this portion is also small. Also, in the present invention, a width of the lower clad layer formed under the MQW layer is suppressed small to the same extent as the width of the MQW layer directly under the MQW layer. As a result, the overlapping of the conductive semiconductor constituting the lower clad layer with the electric field is also small in this area. The high-resistance semiconductor (InP) is formed on both sides of the MQW layer, but the loss of the high-frequency electric signal is seldom generated in this area. In this manner, in the present invention, the overlapping of the conductive semiconductors, which sandwich the MQW layer therebetween vertically, with the electric field generated by the high-frequency electric signal in the neighborhood of the MQW layer can be reduced small, and therefore the loss of the high-frequency electric signal is small.

In the present invention, the core layer in the area between two arms constituting the Mach-Zehnder interferometer is removed, and the semiconductor layer, e.g., the n-InP layer, is formed on the outermost surface from this area. A position of the upper surface of this semiconductor layer is lowered rather than the lower surface of the core layer toward the substrate side. The electric field generated by the high-frequency electric signal is distributed in a space between two arms, but the intensity becomes larger as the position comes closer to the electrode. In the present invention, not the core layer but the semiconductor layer only exists between the arms, and in addition the position is set remote from the electrode downwardly.

Accordingly, the electric field generated in the area between two arms is small. As a result, the loss of the high-frequency electric signal caused by the overlapping of the electric field with the semiconductor becomes small.

In the present invention, the phase modulation electrodes are formed over two arms constituting the Mach-Zehnder interferometer. Then, the first conductivity type semiconductor is formed between the phase modulation electrodes and the core layers. In contrast, the high-resistance semiconductor layer, e.g., the high-resistance InP layer, is formed on the core layer in the area in which the electrodes are not formed over the arms.

When the optical modulation operation is executed, the high-frequency electric signal is transmitted through the phase modulator portions on which the electrodes are formed the present invention, and thus the electric field is generated between the phase modulation electrodes and the first conductivity type clad layer under the core layer. At this time, a part of the high-frequency electric signal that propagated to the phase modulator portion spreads in the optical axis direction, so that the electric field is generated in the areas in which no electrode is formed over the upper surface.

In the present invention, as described above, the high-resistance semiconductor layer is formed on the core layer in the areas in which no electrode is formed on the upper surface. Unlike the conductive semiconductor, the energy loss of the high-frequency electric signal caused by the overlapping with the electric field is very small in the high-resistance semiconductor. Therefore, in the present invention, the loss of the high-frequency electric signal is small in the areas in which no electrode is formed over the arms.

In this manner, in the present invention, the overlapping of the conductive semiconductor or the insulating semiconductor with the electric field, which is caused when the high-frequency electric signal propagates through the device, can be reduced to the required minimum. Thus, the structure is optimized for the propagation of the high-frequency electric signal.

Therefore, the energy loss generated when the high-frequency electric signal propagates through the device is reduced. As a result, such advantages can be attained that a frequency band occupied when the high-frequency electric signal propagates through the device becomes sufficiently large and also an optical modulation band becomes sufficiently large. In the optical modulator in the present invention, a loss factor $\alpha$ when the high-frequency electric signal propagates through the traveling-wave electrodes of the device is given by $\alpha=70$ to $100/m$. This value is largely reduced rather than the loss factor $\alpha=200$ to $250/m$ of the above semiconductor optical modulator in the prior art. Accordingly, the advantage of the present invention is very significant.

In this case, in the present invention, the high-resistance semiconductor layers are formed on both sides of the core layer, and also such high-resistance semiconductor layers as well as the MQW layer, which is put between them, and the clad layers constitute the mesa having a width of almost several $\mu m$. Normally, it is difficult to form the electrode in the narrow area, which is narrow to the same extent as the electric field distribution of the light mode, by the Au-plating, or the like, which causes the manufacturing problem.

In the present invention, the electrodes over two arms are formed in the relatively wide areas that spread over the contact layers and the high-resistance semiconductor layers on the upper surface of the above mesa respectively, and thus such electrodes are ready to manufacture. In this case, the current supplied from the electrode flows through only the contact layer between the high-resistance semiconductor layers.

DETAILED DESCRIPTION OF THE PREFERRED EMBODIMENTS

Embodiments of the present invention will be explained with reference to the drawings hereinafter.

First Embodiment

Figure 1:
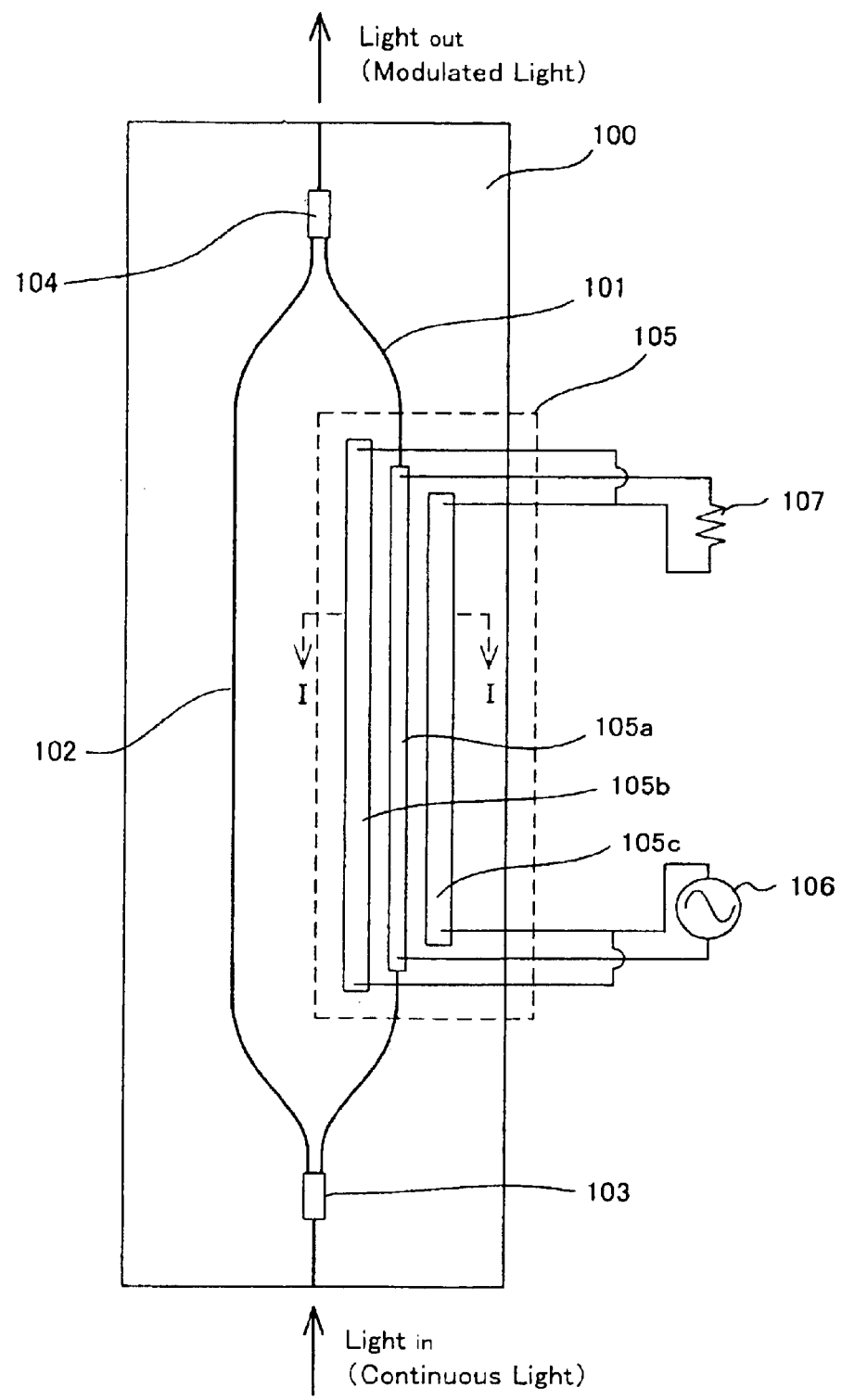
FIG. 1 is a plane view showing an example of a Mach-Zehnder optical modulator in the prior art.
Figure 2:
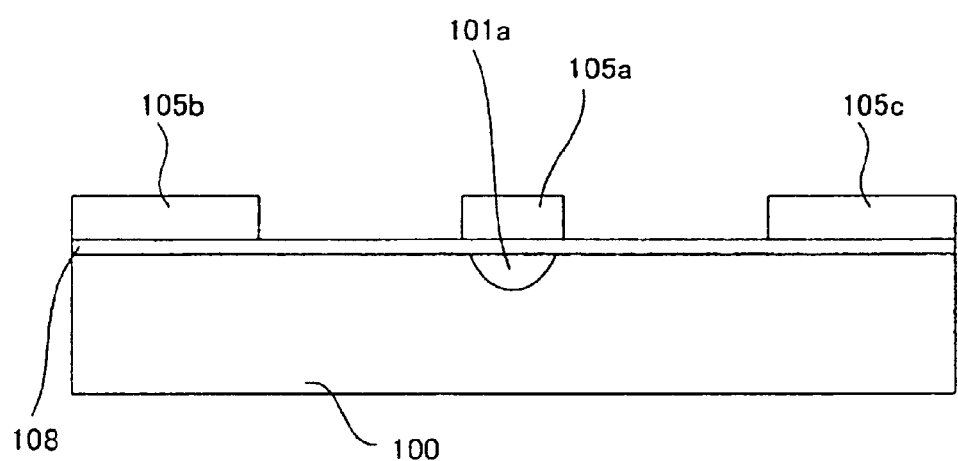
FIG. 2 is a sectional view showing the example of the Mach-Zehnder optical modulator in the prior art.
Figure 3:
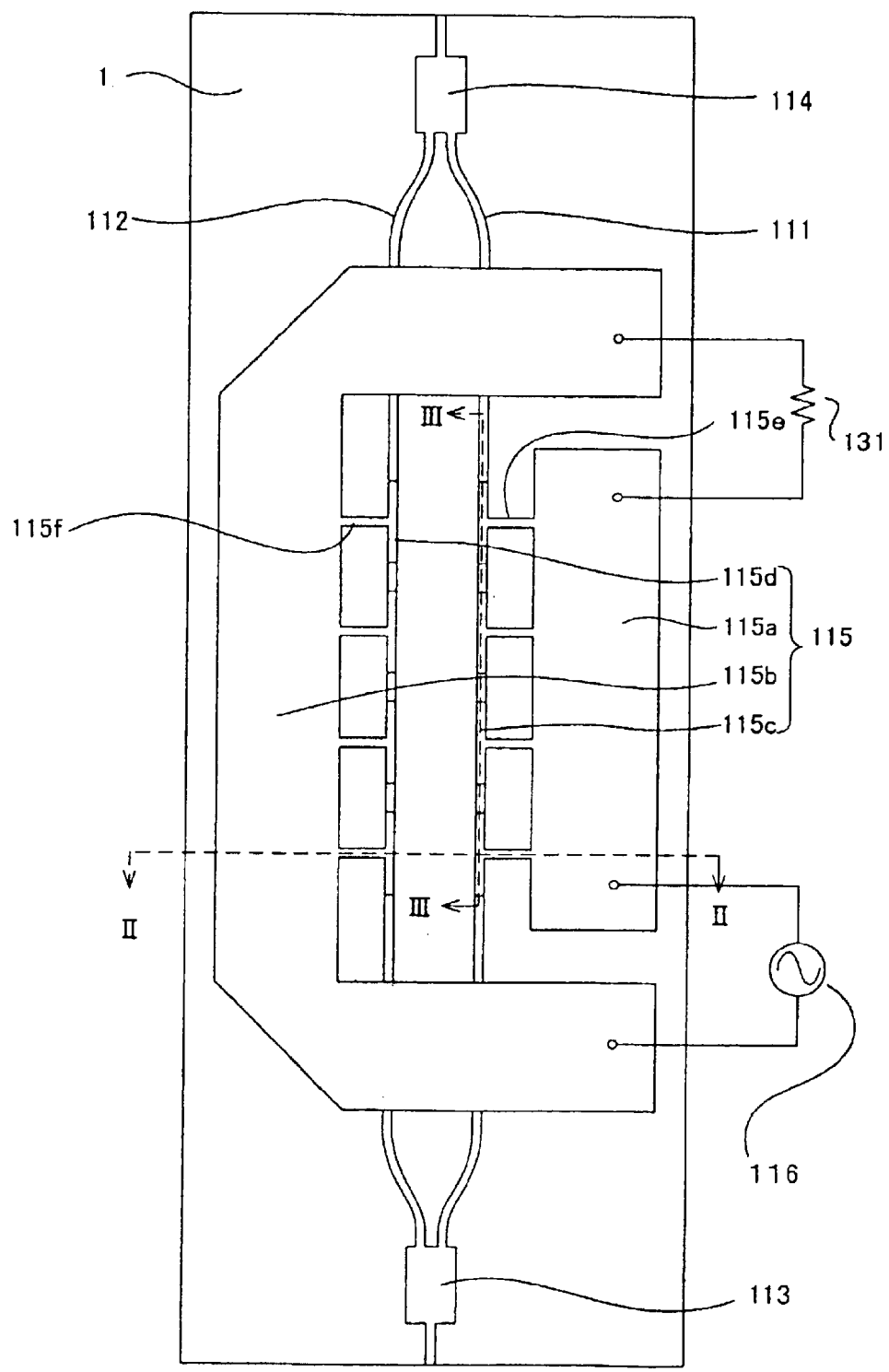
FIG. 3 is a top view of a semiconductor optical modulator in the prior art.
Figure 4:
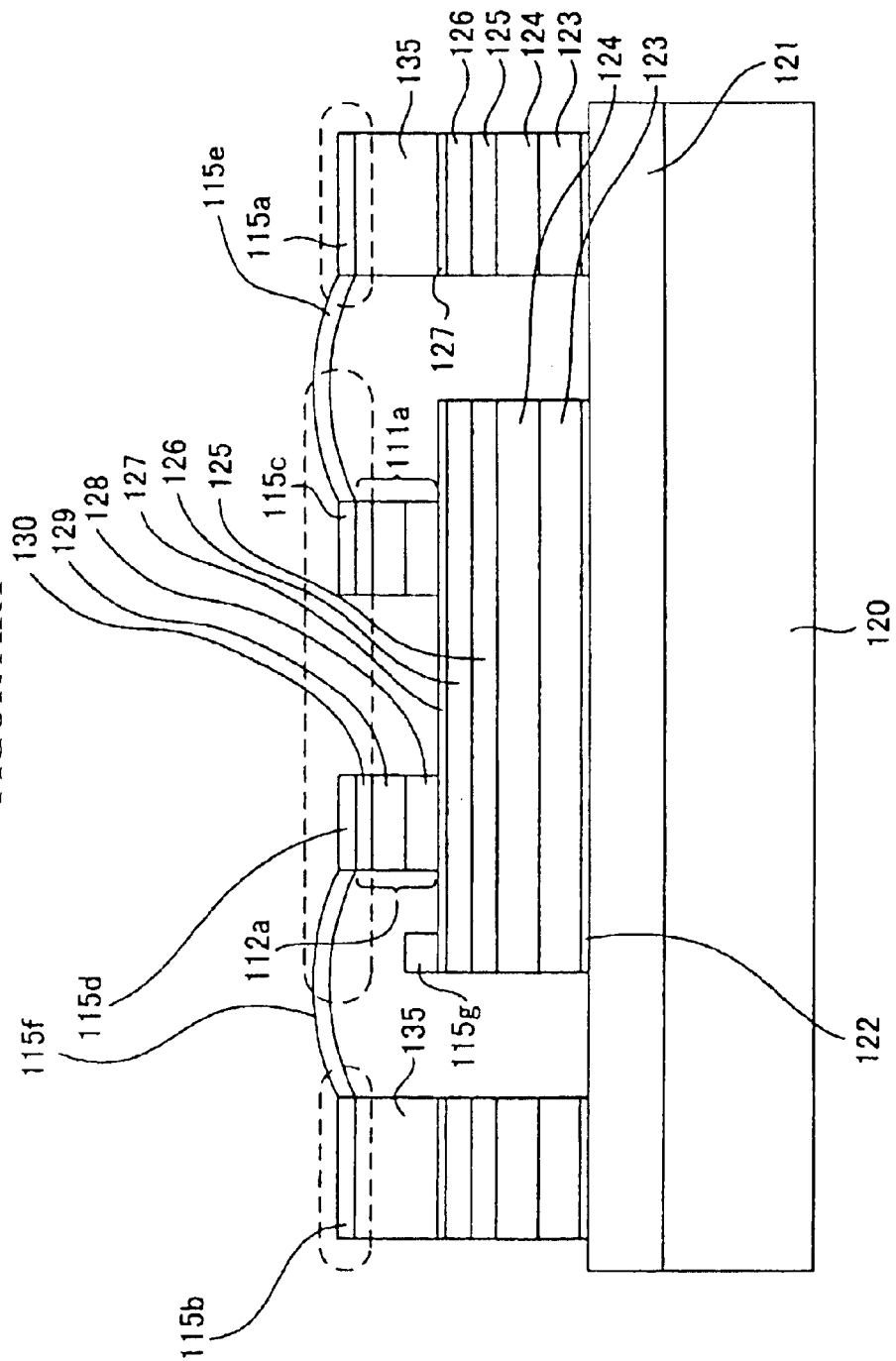
FIG. 4 is a sectional view of the semiconductor optical modulator in the prior art.
Figure 5:
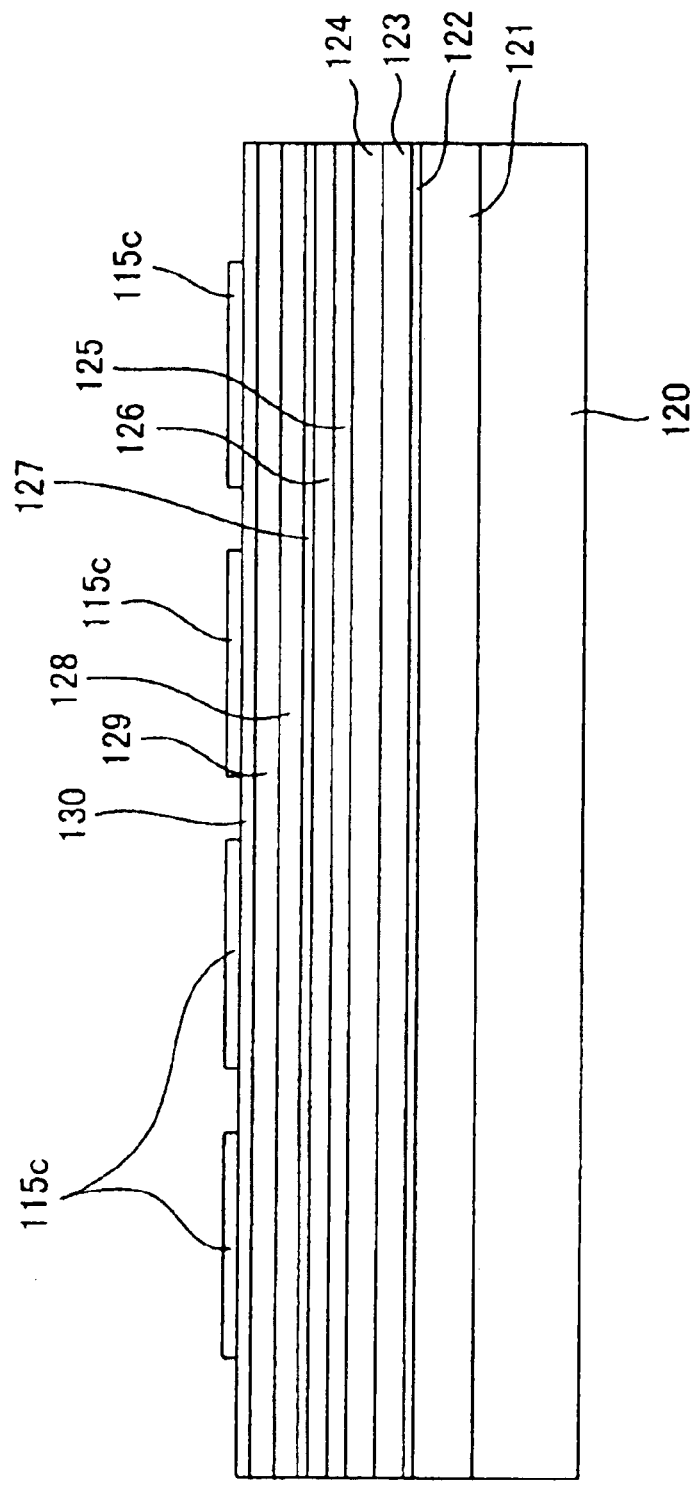
FIG. 5 is another sectional view of the semiconductor optical modulator in the prior art.
Figure 6:
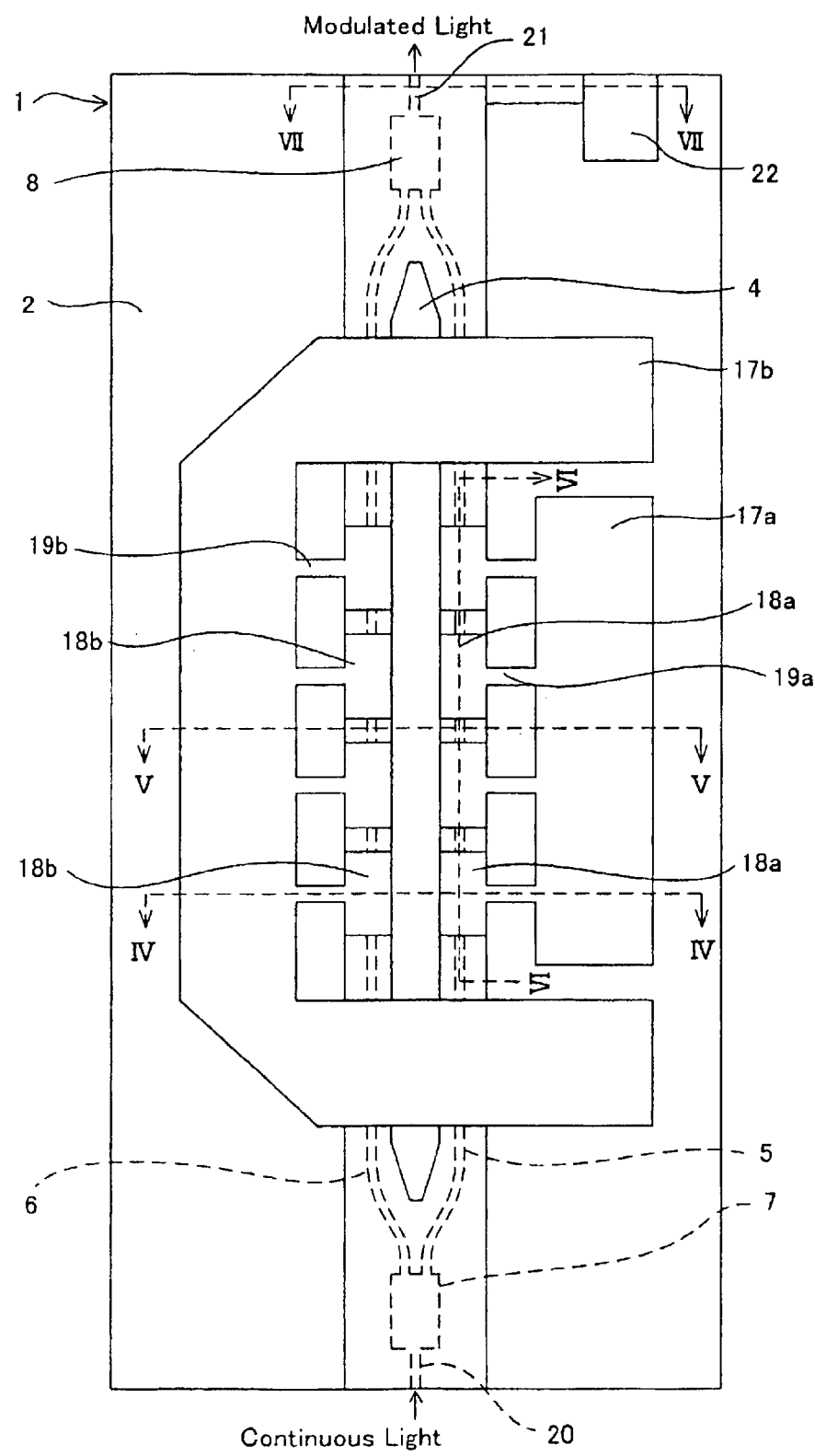
FIG. 6 is a top view of a semiconductor optical modulator according to a first embodiment of the present invention.
Figure 7:
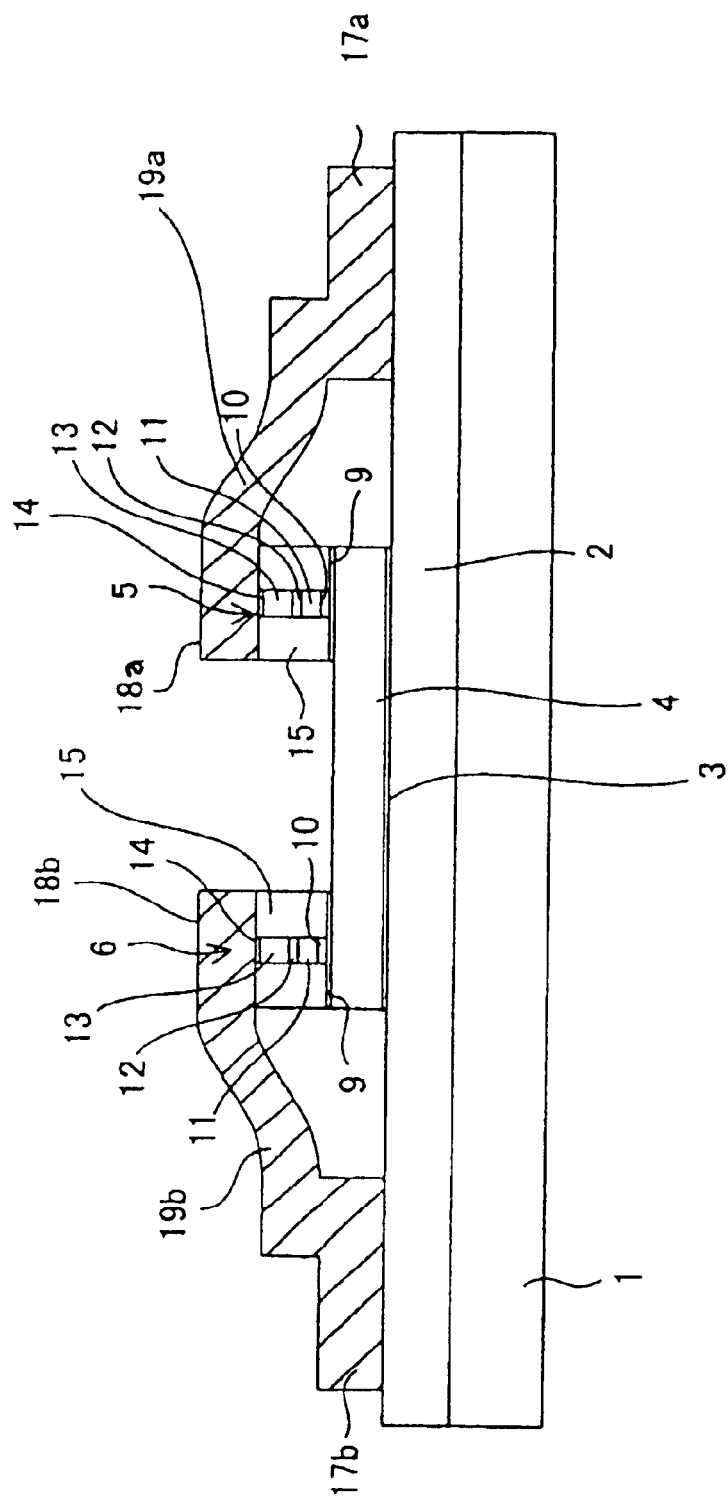
FIG. 7 is a first sectional view of the semiconductor optical modulator according to the first embodiment of the present invention.
Figure 8:
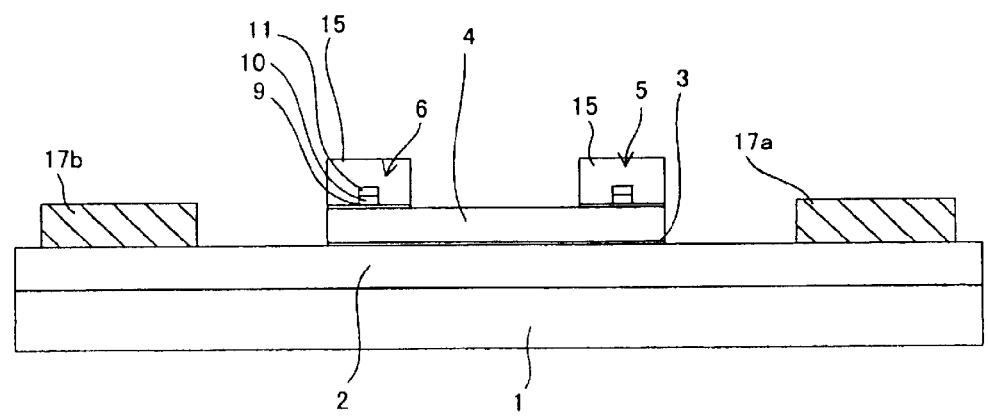
FIG. 8 is a second sectional view of the semiconductor optical modulator according to the first embodiment of the present invention.
Figure 9:
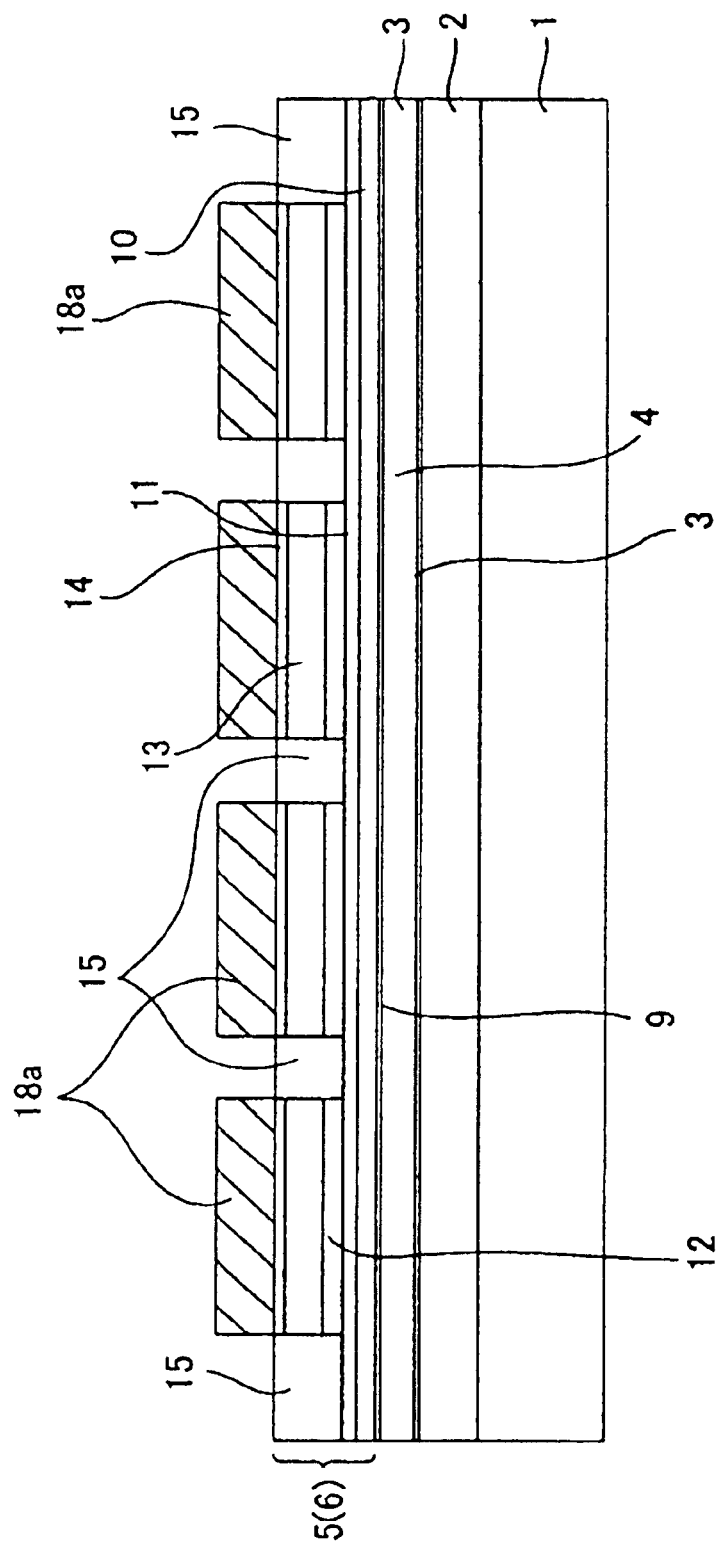
FIG. 9 is a third sectional view of the semiconductor optical modulator according to the first embodiment of the present invention.
Figure 10:
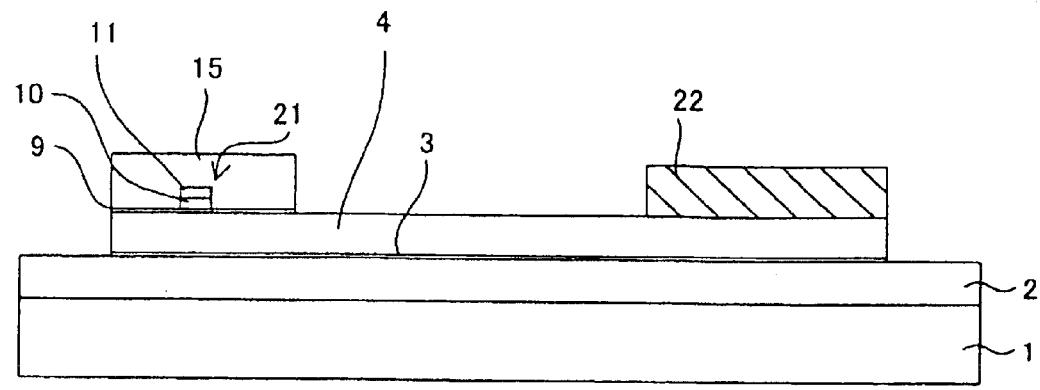
FIG. 10 is a fourth sectional view of the semiconductor optical modulator according to the first embodiment of the present invention.

FIG. 6 is a plane view showing a semiconductor optical modulator according to a first embodiment of the present invention. FIG. 7 is a sectional view taken along a IV—IV line in FIG. 6, FIG. 8 is a sectional view taken along a V—V line in FIG. 6, FIG. 9 is a sectional view taken along a VI—VI line in FIG. 6, and FIG. 10 is a sectional view taken along a VII—VII line in FIG. 6.

A Mach-Zehnder optical modulator according to the present embodiment is formed on a high-resistance InP substrate 1.

A high-resistance InP buffer layer 2 is formed on an overall surface of the high-resistance InP substrate 1. An n-type conductivity InP bias layer (n-InP layer) 4 having an almost square planar shape that passes through the almost middle is formed over the high-resistance InP buffer layer 2. A DC bias is applied to this n-InP bias layer 4 from the DC bias electrode, described later, and a thickness and a width of the n-InP bias layer 4 are shaped into about 1.5 μm and 26.0 μm respectively. A dopant of the n-InP bias layer 4 is silicon and a dopant concentration is set to $1.0 \times 10^{18}/cm^3$.

A first undoped InGaAsP (i-InGaAsP) etch-stop layer 3 of 50 nm thickness is formed between the n-InP bias layer 4 and the high-resistance InP buffer layer 2.

First and second buried-type optical waveguides (arms) 5, 6 and first and second multimode interference (MMI) optical couplers 7, 8 are formed on the n-InP bias layer 4. A Mach-Zehnder interferometer is composed of these elements.

The first and second buried-type optical waveguides 5, 6 are formed separately in an area between the first and second MMI optical couplers 7, 8. Light incident ends of these optical waveguides 5, 6 are connected to a light emissive end of the first MMI optical couplers 7, and also light emissive ends of these optical waveguides 5, 6 are connected to a light incident end of the second MMI optical coupler 8.

The optical waveguides 5, 6 have structures shown in FIG. 6 and FIG. 7.

A stripe-like undoped multiple quantum well (i-MQW) layer 11 having a width of 1.5 μm is formed as the core layer along the optical axis in two arms 5, 6 constituting the Mach-Zehnder interferometer respectively. This MQW layer 11 has a well layer consisting of 15 layers, and each well layer is sandwiched by barrier layers. Materials of the well layer and the barrier layer are InP and InGaAsP respectively. Also, both film thicknesses of the well layer and the barrier layer are set to 10 nm. The i-MQW layer 11 has a width that is almost equivalent to a beam diameter of the electric field distribution in the propagation basic mode of the optical waveguides 5, 6. The PL luminous wavelength of the i-MQW layer 11 is 1.43 μm.

An undoped InP layer (i-InP layer) 12 of 0.2 μm thickness, a p-type conductivity InP layer (p-InP layer) 13 of 2.0 μm thickness, and a p-type conductivity InGaAs layer (p-InGaAs layer) 14 of 0.3 μm thickness are formed on or over the i-MQW layer 11. A dopant of the p-InP layer 13 and the p-InGaAs layer 14 is zinc (Zn), and a dopant concentration is set to $1.0 \times 10^{18}/cm^3$ and $2.0 \times 10^{19}/cm^3$ respectively.

As shown in FIG. 7, FIG. 8 and FIG. 9, the i-InP layer 12, the p-InP layer 13, and the p-InGaAs layer 14, which are formed on or over the i-MQW layer 11 to have a length of 35.0 μm, are arranged at an interval of 20.0 μm at 20 places to respective phase modulation areas of the first and second buried-type optical waveguides (arms) 5, 6 in the light traveling direction so as to stand vertically as projected portions. In this case, the number of these layers is omitted partially on account of space, and these layers are depicted only at four places in these Figures.

Also, an n-InP layer 10 of 0.3 µm thickness is formed under the i-MQW layer 11 along the optical axis direction. The i-MQW layer 11 and the n-InP layer 10 are formed in parallel with the optical axis to have a uniform film thickness. A dopant of the n-InP layer 10 is Si, and a dopant concentration is set to $1.0 \times 10^{18}/cm^3$.

All widths of the n-InP layer 10, the i-InP layer 12, the p-InP layer 13, and the p-InGaAs layer 14 are set equal to a width of the i-MQW layer 11 as 1.5 µm. A high-resistance InP layer (SI-InP layer) 15 into which iron (Fe) is doped is buried around respective layers from the n-InP layer 10 to the p-InGaAs layer 14. Also, the SI-InP layer 15 is buried between the projected portions that are disconnected in the optical axis direction and made of the i-InP layer 12, the p-InP layer 13, and the p-InGaAs layer 14.

A recess portion is formed in the SI-InP layer 15 between the phase modulation areas of the first and second optical waveguides 5, 6 to expose an upper surface of the n-InP bias layer 4. In other words, in the phase modulation areas, the upper surface of the n-InP bias layer 4 is positioned lower than the p-InGaAs layer 14 and the i-MQW 11 between two optical waveguides 5, 6.

An upper surface of the SI-InP layer 15 as well as an upper surface of the p-InGaAs layer 14 constitutes a flat surface. The SI-InP layer 15 together with the n-InP layer 10, the i-MQW layer 11, the i-InP layer 12, the p-InP layer 13, and the p-InGaAs layer 14 constitutes a mesa structure on the n-InP bias layer 4. A width of the mesa structure in the phase modulation area is set to 8.0 µm.

In this case, a second InGaAsP etch-stop layer 9 of 50 nm thickness is formed between the mesa structure and the n-InP bias layer 4. A total thickness of the second InGaAsP etch-stop layer 9 and the n-InP layer 10 is set to 0.3 µm.

In the above optical waveguides 5, 6, as a matter of convenience, the i-MQW layer 11 as the core is shown in Figures, but the upper and lower layers 10, 12 to 14, 15 are also contained in their structures. This is similarly true of following embodiments. Also, in the optical waveguides 5, 6, the refractive index of the i-MQW layer 11 as the core is set higher than the refractive indexes of the neighboring InP layers.

In the Mach-Zehnder optical modulator shown in FIG. 6 to FIG. 10, a slot-line type electrode and an electrode used for the phase modulation are formed by the Au-plating. In this case, the slot-line type electrode is called a slot-line electrode hereinafter, and the electrode used for the phase modulation is called a phase modulation electrode hereinafter.

First and second slot-line electrodes 17a, 17b are formed by the Au-plating in areas, which are remote from both side surfaces of the n-InP bias layer 4 by 10.0 µm, to have a width of 20.0 µm and a film thickness of 4.0 µm. Also, phase modulation electrodes 18a, 18b each having a 3.0 µm thickness are formed on the p-InGaAs layer 14, which is exposed from the top surface of the mesa structure intermittently at an interval of 20.0 µm, and the SI-InP layers 15 formed on both sides of the p-InGaAs layer 14 by the Au-plating respectively. The p-InGaAs layers 14 act as contact layers of the phase modulation electrodes 18a, 18b.

As a result, the phase modulation electrodes 18a, 18b are formed at 20 places on two optical waveguides 5, 6 constituting the Mach-Zehnder interferometer respectively. In this case, the phase modulation electrodes 18a, 18b are not formed on the SI-InP layers 15 and over the i-MQW layer 11, which are positioned between 20 p-InGaAs layers 14.

Also, the slot-line electrodes 17a, 17b and the phase modulation electrodes 18a, 18b are connected electrically via air-bridge wirings 19a, 19b, which are formed by the Au-plating, respectively.

A stripe-like third optical waveguide 20, which is constructed by covering the n-InP layer 10 and the i-MQW layer 11 with the SI-InP layers 15, is connected to a light incident end of the first MMI optical coupler 7 in the light incident area over the n-InP bias layer 4. Also, a stripe-like fourth optical waveguide 21, which is constructed by covering the n-InP layer 9 and the i-MQW layer 11 with the SI-InP layers 15, is connected to a light emissive end of the second MMI optical coupler 8 in the light emissive area over the n-InP bias layer 4.

In this case, the first and second MMI optical couplers 7, 8 are formed wider in width than the first and second optical waveguides 5, 6, and have the same layer-structure as the third and fourth optical waveguides 20, 21.

As shown in FIG. 6 and FIG. 10, the above n-InP bias layer 4 is expanded toward one side of the fourth optical waveguide 21 by a width of 80.0 µm. Then, a DC bias electrode pad 22 having a 4.0 µm thickness and used to apply the DC bias voltage is formed by the Au-plating in an area that is defined inwardly by 50.0 µm from an end of a projected portion of the expanded n-InP bias layer 4. Thus, a distance between the fourth optical waveguide 21 and the DC bias electrode pad 22 becomes 30.0 µm. In this case, a length of the DC bias electrode pad 22 in the light traveling direction is 50.0 µm, and the lower n-InP bias layer 4 has the same planar shape as the DC bias electrode pad 22. Also, a length of the n-InP bias layer 4, which is formed in an area between the DC bias electrode pad 22 and the fourth optical waveguide 21, along the light traveling direction is 10.0 µm.

Figure 11:
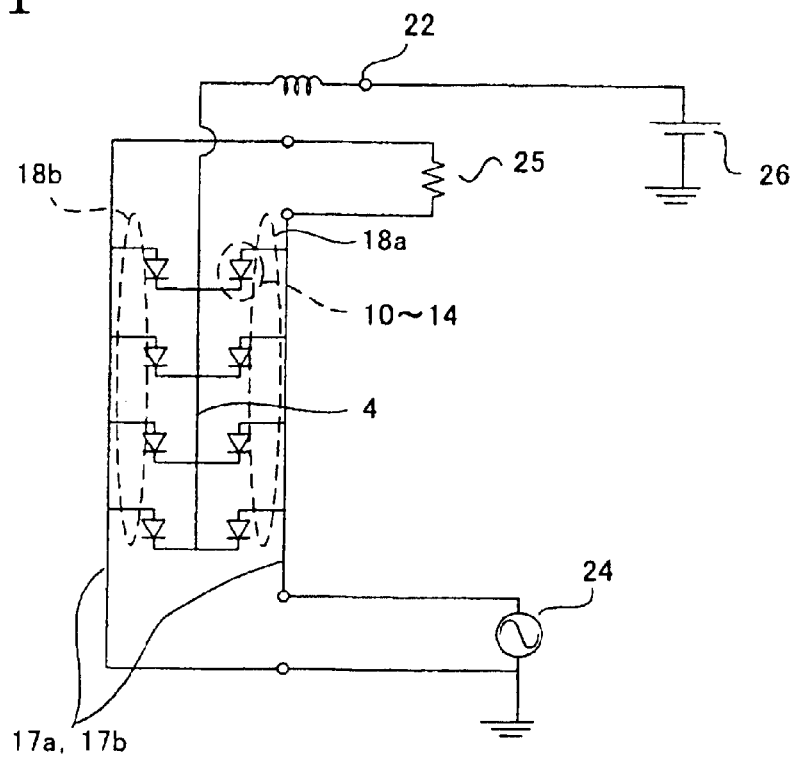
FIG. 11 is an equivalent driving circuit diagram of the semiconductor optical modulator according to the first embodiment of the present invention.

FIG. 11 is an equivalent circuit applied when the Mach-Zehnder optical modulator shown in FIG. 6 to FIG. 10 is driven. In this optical modulator, one ends of the slot-line electrodes 17a, 17b receive a high-frequency electric signal being input from a high-frequency electric signal source 24, and the other ends of the slot-line electrodes 17a, 17b are terminated by a 50 Ω terminating resistance 25. Also, lower portions of the cores, each consisting of the i-MQW layer 11, in two optical waveguides 5, 6 that constitute the Mach-Zehnder interferometer are connected mutually by the n-InP bias layer 4. Electric potentials at lower surfaces of the i-MQW layers 11 are set substantially equal to each other between two optical waveguides 5, 6. In addition, the n-InP bias layer 4 is formed continuously between both ends of the optical modulator, and is connected to the DC bias electrode pad 22.

The n-InP bias layer 4 acts equivalently as an inductance, and the p-InP layer 13, the i-MQW layers 11, and the n-InP layer 10 act equivalently as a diode respectively.

Then, at the time of driving the optical modulator, the potential of the n-InP bias layer 4 is adjusted to a desired value by applying the DC bias to the DC bias electrode pad 22 from a DC voltage source 26.

The continuous light being input from the third optical waveguide 20 is divided into two routes of the first and second optical waveguides 5, 6 via the first MMI optical coupler 7. Then, the light is phase-modulated by the high-frequency signal supplied to the first phase modulation electrode 18a in the phase modulation area of the first optical waveguide 5, and then proceeds to the second MMI optical coupler 8. At the same time, the light is phase-modulated by the high-frequency signal supplied to the second phase modulation electrode 18b in the phase modulation area of the second optical waveguide 6, and then goes to the second MMI optical coupler 8.

The lights that are phase-modulated in the first optical waveguide 5 and the second optical waveguide 6 respectively are combined together by the second MMI optical coupler 8 to produce a light-intensity modulated signal. Such light-intensity modulated signal travels via the fourth optical waveguide 21. In this case, in the optical modulator, the n-InP layer 10, the i-InP layer 12, and the p-InP layer 13 formed on and under, or above and below the i-MQW layers 11 serving as the core function as the clad layer respectively, and the SI-InP layer 15 also function as the clad layer. As a result, the light travels through the i-MQW layers 11 as the center.

Next, a method of manufacturing the optical modulator according to the first embodiment will be explained hereunder.

Figure 12:
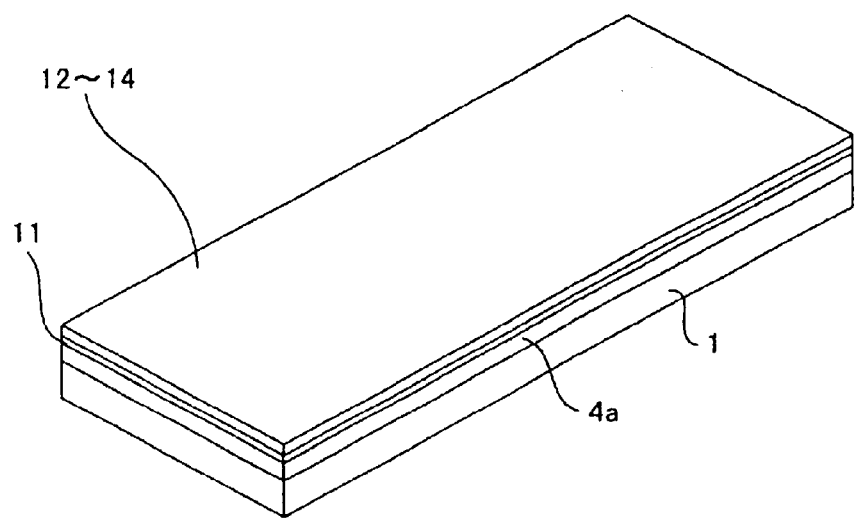
FIG. 12 is a perspective view showing an initial film forming state in steps of forming the semiconductor optical modulator according to the first embodiment of the present invention.

FIG. 12 is a perspective view showing steps of forming films of the semiconductor optical modulator according to the first embodiment of the present invention. FIG. 13, FIG. 14, FIG. 15, FIG. 16 and FIG. 17 are plane views showing the steps of forming the semiconductor optical modulator according to the first embodiment of the present invention. FIG. 18, FIG. 19, FIG. 20, FIG. 21 and FIG. 22 are perspective views showing the steps of forming a part of the semiconductor optical modulator according to the first embodiment of the present invention.

In this case, FIG. 18, FIG. 19, FIG. 20, FIG. 21 and FIG. 22 show a perspective cross-section of the area encircled by a broken line in FIG. 13, FIG. 14, FIG. 15, FIG. 16 and FIG. 17.

First, a wafer in which an n-InP layer 4a, the undoped multiple quantum well (i-MQW) layer 11, the i-InP layer 12, the p-InP layer 13, and the p-InGaAs layer 14 are formed uniformly and sequentially on or over the high-resistance InP substrate 1 by the MOVPE method is prepared. Assume that an upper surface of the high-resistance InP substrate 1 contains the high-resistance InP buffer layer 2 that is formed by the MOVPE method. Also, the n-InP layer 4a is formed to have a thickness of about 1.8 μm.

In this case, as described above, the InGaAsP etch-stop layer 9 is formed at a height of 1.5 μm from a lower surface of the n-InP layer 4a, and the InGaAsP etch-stop layer 3 is formed between the lower surface of the n-InP layer 4a and the high-resistance InP substrate 1. These etch-stop layers 3, 9 are omitted from Figures.

Then, a mask (not shown) made of SiO₂ is formed in the phase modulation areas. The mask has such a planar shape that a plurality of stripes that extend in the direction perpendicular to the light traveling direction are formed at an interval of 20 μm in the light traveling direction. Each stripe has a width of 35 μm in the light traveling direction.

Then, the i-InP layer 12, the p-InP layer 13, and the p-InGaAs layer 14 located in the areas that are not covered with the mask are removed by the etching to expose the i-MQW layer 11.

Figure 13:
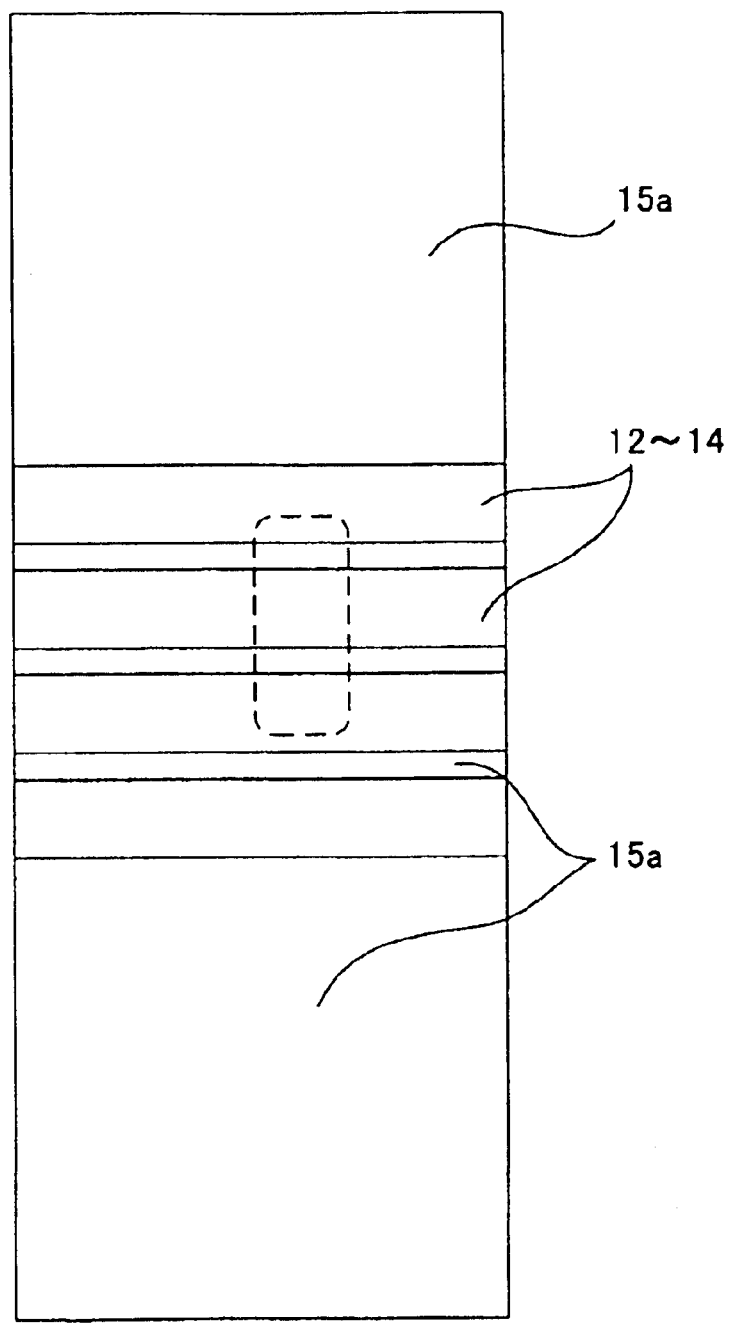
FIG. 13, FIG. 14, FIG. 15, FIG. 16 and FIG. 17 are plane views showing the steps of forming the semiconductor optical modulator according to the first embodiment of the present invention.
Figure 18:
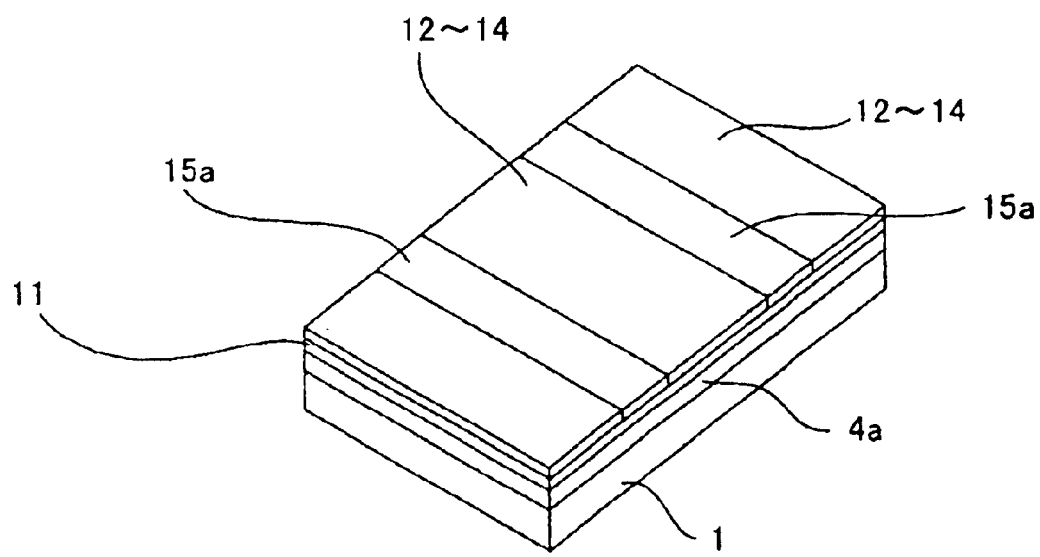
FIG. 18, FIG. 19, FIG. 20, FIG. 21 and FIG. 22 are perspective views showing the steps of forming the semiconductor optical modulator according to the first embodiment of the present invention.

Then, as shown in FIG. 13, a first SI-InP layer 15a of about 2.5 μm thickness is formed on the i-MQW layer 11 exposed from the areas that is not covered with the mask. Then, the mask is removed. A perspective cross-section of the area that is encircled by a broken line in FIG. 13 is shown in FIG. 18. In this case, the first SI-InP layer 15a is not grown on the mask made of SiO₂.

The steps executed up to now are carried out by the lithography technology, the etching technology, and the re-growing technology using the MOVPE method.

Figure 14:
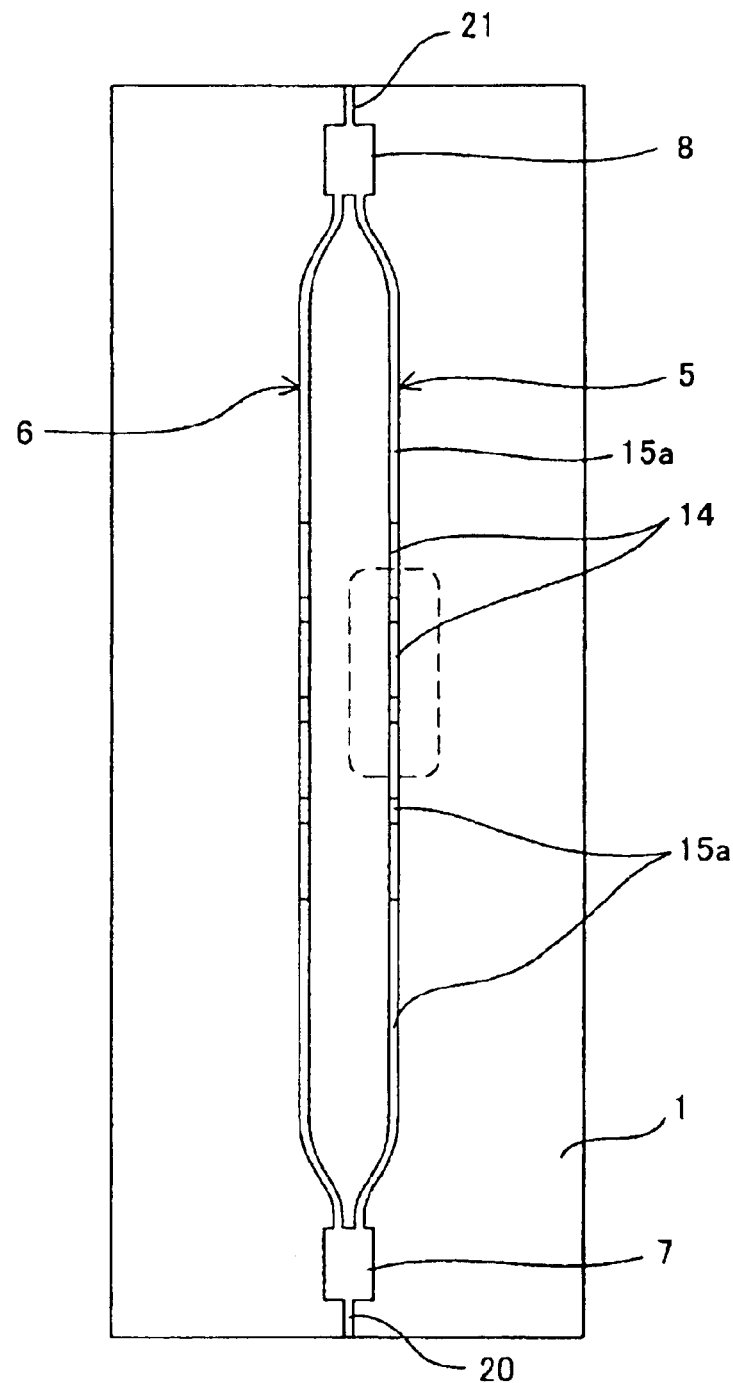
Figure 19:
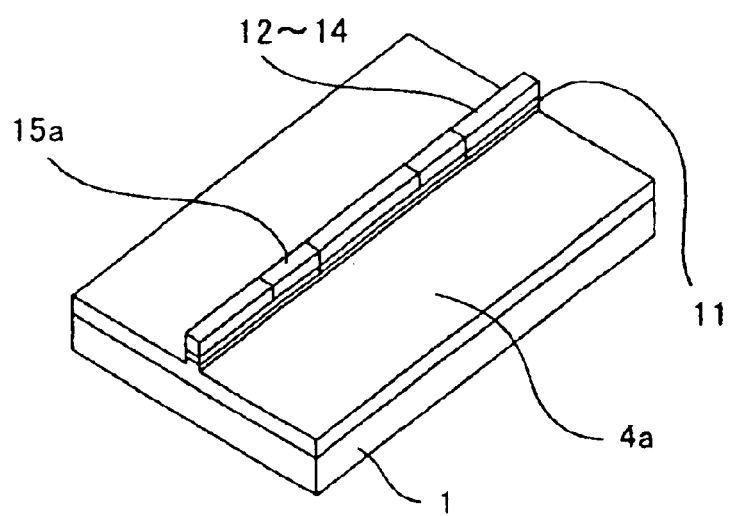

Then, as shown in FIG. 14 and FIG. 19, the n-InP layer 4a, the i-MQW layer 11, the i-InP layer 12, the p-InP layer 13, the p-InGaAs layer 14, and the first SI-InP layer 15a are processed by the dry etching technology. Thus, the first to fourth optical waveguides 5, 6, 20, 21 each having a width of 1.5 μm and the first and second MMI optical couplers 7, 8 each having a width of 18 μm, which constitute the Mach-Zehnder interferometer, are formed. In this case, the SiO₂ mask (not shown) having respective planar shapes of the first to fourth optical waveguides 5, 6, 20, 21 and the first and second MMI optical couplers 7, 8 is formed on the first SI-InP layer 15a and the p-InGaAs layer 14. Also, the etching of the n-InP layer 4a is executed to leave a thickness of 1.5 μm from the lower surface of the n-InP layer 4a. At this time, the etching is stopped prior to the InGaAsP etch-stop layer 9 in the n-InP layer 4a to leave this layer.

As shown in FIG. 7 to FIG. 10, the projected portion of the n-InP layer 4a formed in this manner becomes the n-InP layer 10 that has the same planar shape as the i-MQW layer 11 of the first to fourth optical waveguides 5, 6, 20, 21.

Figure 15:
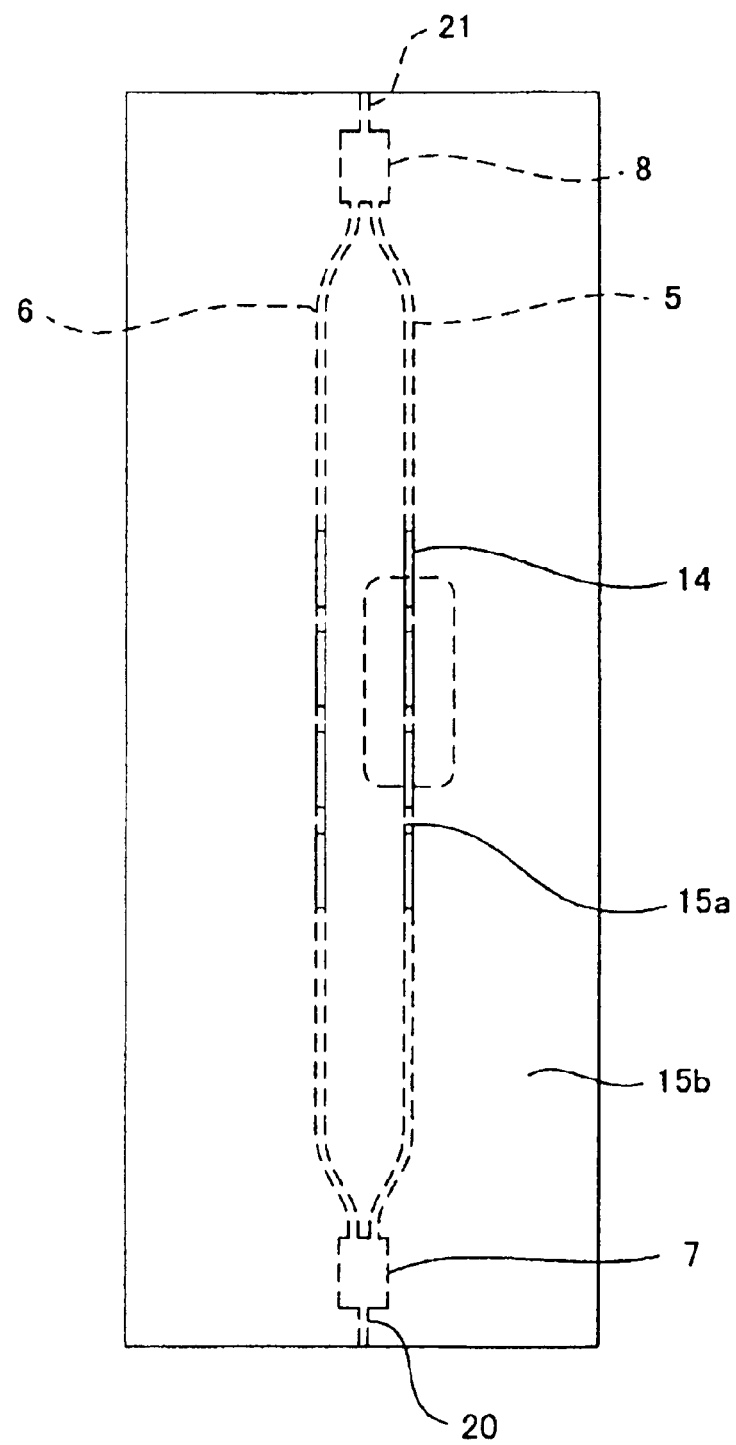
Figure 20:
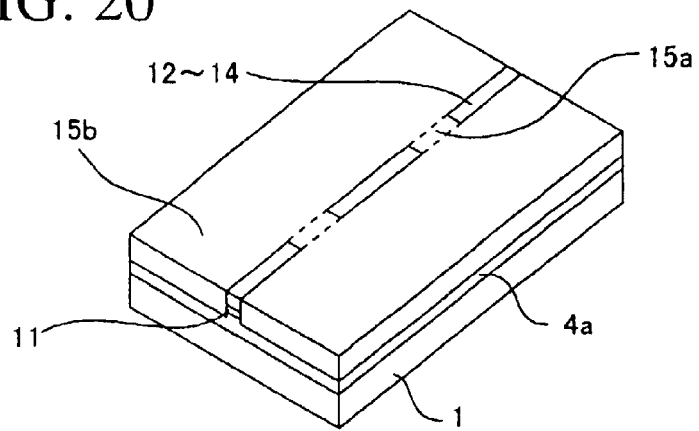

Then, as shown in FIG. 15 and FIG. 20, in the state that the SiO₂ mask (not shown) is still left, a second SI-InP layer 15b of about 3.3 μm thickness is grown selectively on the n-InP layer 4a, which is exposed by the dry etching, by using the burying growth technology by virtue of the MOVPE method. Then, the SiO₂ mask is removed.

Then, an SiO₂ mask (not shown) is formed on the first and second SI-InP layers 15a, 15b and the p-InGaAs layer 14. Such SiO₂ mask covers stripe-like areas, which pass under the first to fourth optical waveguides 5, 6, 20, 21 and the first and second MMI optical couplers 7, 8 constituting the Mach-Zehnder interferometer, and the expanded area to the DC bias electrode pad 22. This SiO₂ mask has a shape to cover the area that extrudes from the stripe-like first and second optical waveguides 5, 6 by 3.25 μm.

Figure 16:
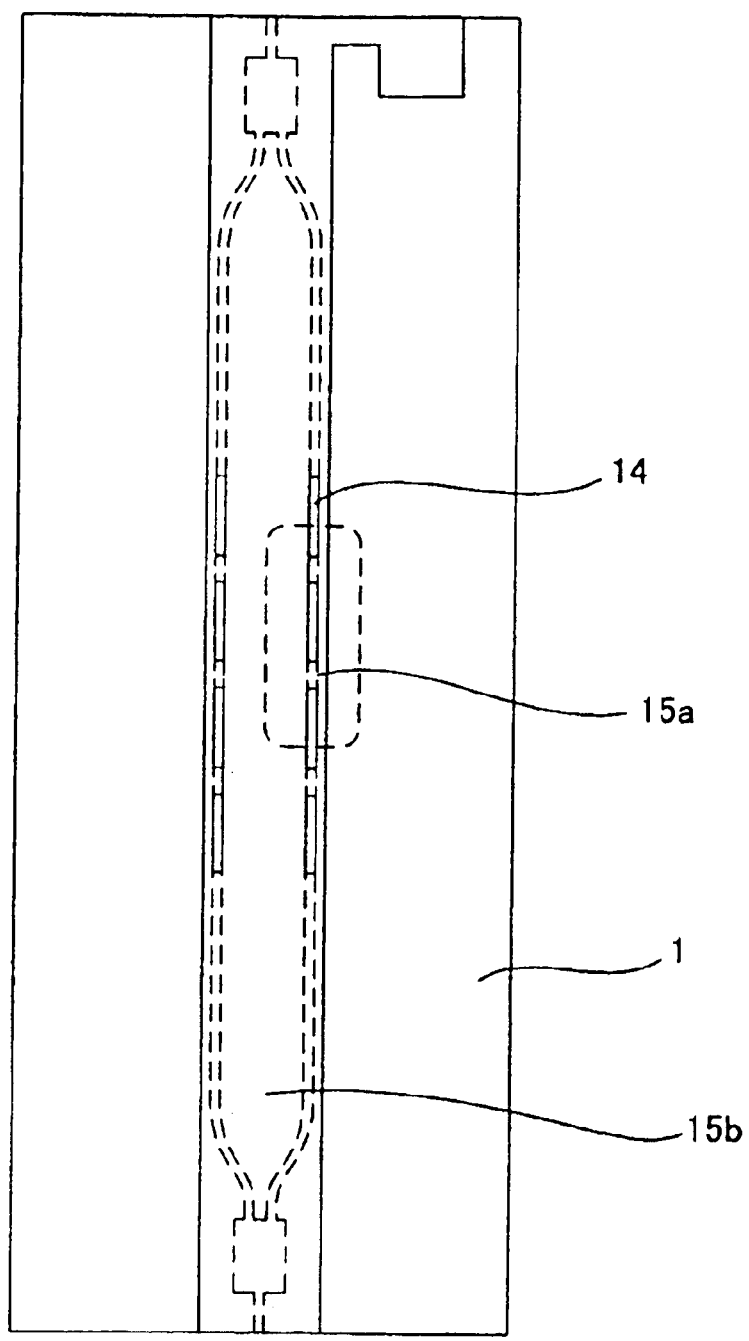
Figure 21:
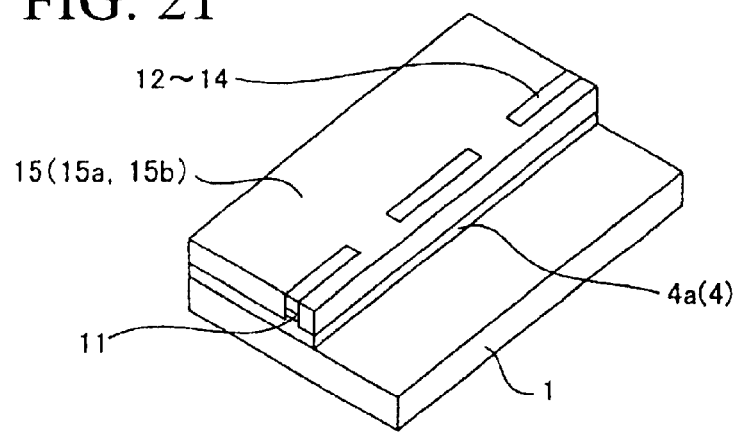

Then, as shown in FIG. 16 and FIG. 21, the high-resistance InP substrate 1 is exposed by applying the wet-etching to the second SI-InP layer 15b and the lower n-InP layer 4a, which are exposed from the SiO₂ mask (not shown). At this time, the wet-etching can be executed with good precision because of the InGaAsP etch-stop layer 3 formed under the n-InP layer 4a. This etch-stop layer 3 is etched selectively by the etching using another etchant after the wet-etching is completed. Thus, the patterned n-InP layer 4a gives the n-InP bias layer 4 shown in FIG. 7 to FIG. 10.

Figure 17:
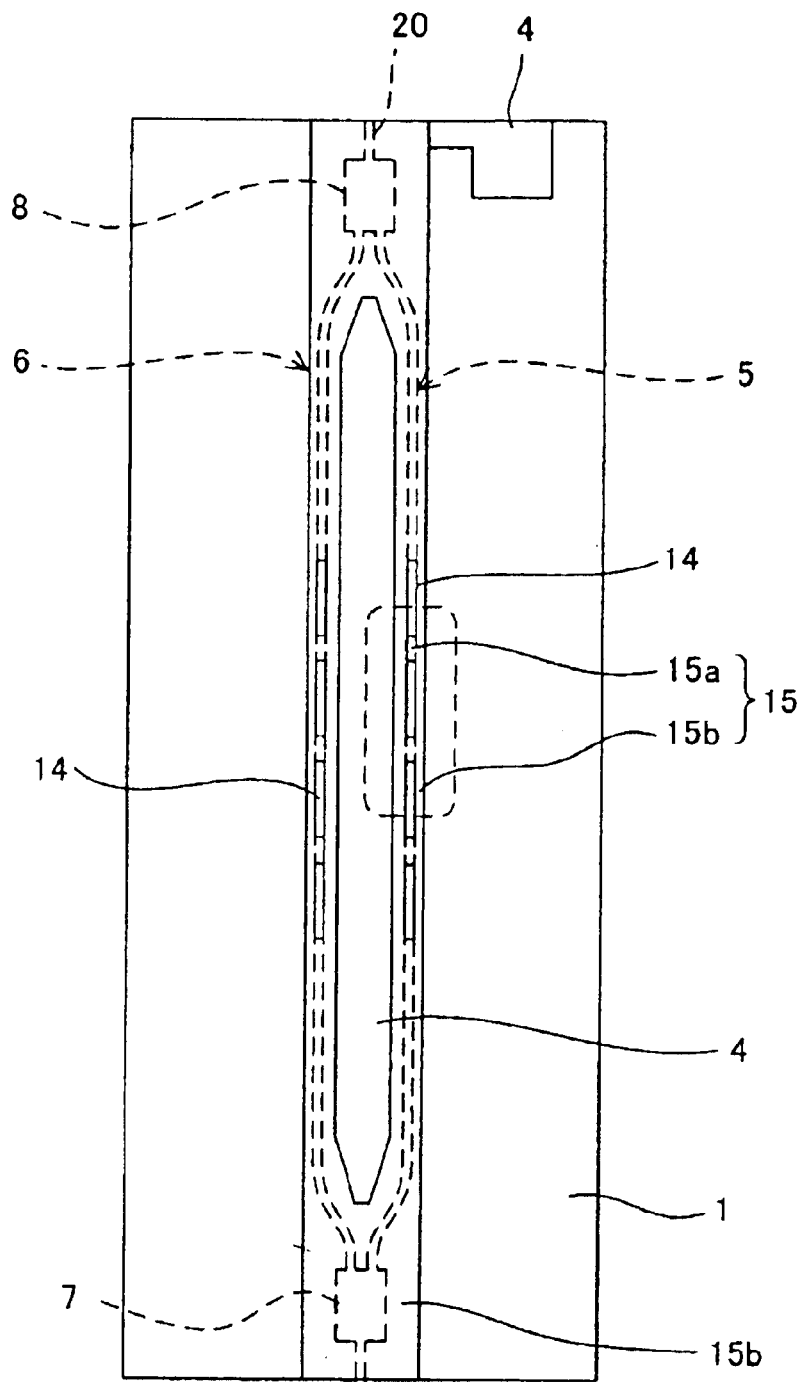
Figure 22:
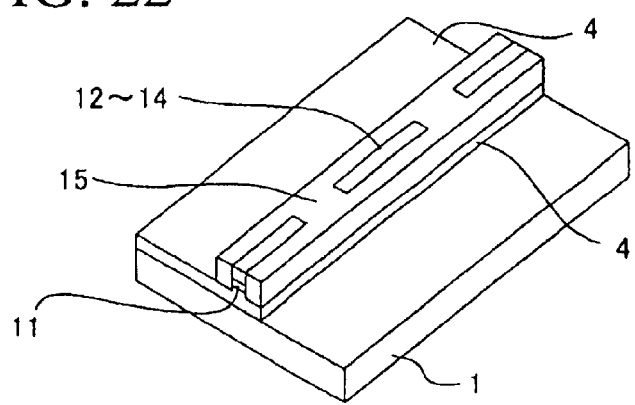

Then, the SiO₂ mask (not shown) is removed. Then, as shown in FIG. 17 and FIG. 22, the lower n-InP bias layer 4 is exposed by etching the second SI-InP layer 15b which is located in the area between the first and second optical waveguides 5, 6 in such a manner that the second SI-InP layer 15b is left on mutual opposing side surfaces of the first and second optical waveguides 5, 6 by a width of 3.25 μm. At that time, the wet-etching can be executed with good precision because of the InGaAsP etch-stop layer 9 formed in the second SI-InP layer 15b. This etch-stop layer 9 is removed by another wet etching after the wet-etching is completed. At the same time, the second SI-InP layer 15b in the area extended from the fourth optical waveguide 21 to the DC bias electrode pad 22 is etched to expose the extended area of the n-InP bias layer 4. Thus, the left SI-InP layers 15a, 15b give the SI-InP layer 15 shown in FIG. 7 to FIG. 10. In this case, the SiO₂ mask is used to pattern the second SI-InP layer 15b.

Lastly, the slot-line electrodes 17a, 17b, the phase modulation electrodes 18a, 18b, the air-bridge wirings 19a, 19b, and the DC bias electrode pad 22 are formed on or over the surface of the device by the Au-plating. This Au-plating is executed separately in two steps.

According to the first plating step, the slot-line electrodes 17a, 17b and the DC bias electrode pad 22 shown in FIG. 6 are formed to have a thickness of 4 µm. Then, according to the second plating, the phase modulation electrodes 18a, 18b shown in FIG. 6 are formed to have a thickness of 3 µm. At this time, the phase modulation electrodes 18a, 18b and the slot-line electrodes 17a, 17b are connected by the air-bridge wirings 19a, 19b that are formed by the Au-plating. In forming these electrodes by the Au-plating, the selective plating method using the resist pattern, for example, is employed. Also, spaces are formed under the air-bridge wirings 19a, 19b by forming resist patterns, for example, between the p-InGaAs layer 14 and the slot-line electrodes 17a, 17b prior to the second Au-plating and then removing the resist patterns after the Au-plating.

The second slot-line electrode 17b is leaded to the neighborhood of the first slot-line electrode 17a as the air bridge structures over the first and second optical waveguides 5, 6 by the second Au-plating step. In this case, the resist, for example, may be formed on the first and second optical waveguides 5, 6, and then such resist may be selectively removed after the air bridge structures are formed.

By the way, if each length of the phase modulation electrode 18a (18b), an occupied rate of the phase modulation electrode 18a (18b) to the total length of the optical waveguide 5 (6), and a total thickness of the core layer 11 and the upper undoped layer 12 are adjusted, it is possible to cause the characteristic impedance of the traveling-wave electrode of the device to substantially coincide with 50 Ω or a desired value.

Second Embodiment

Figure 23:
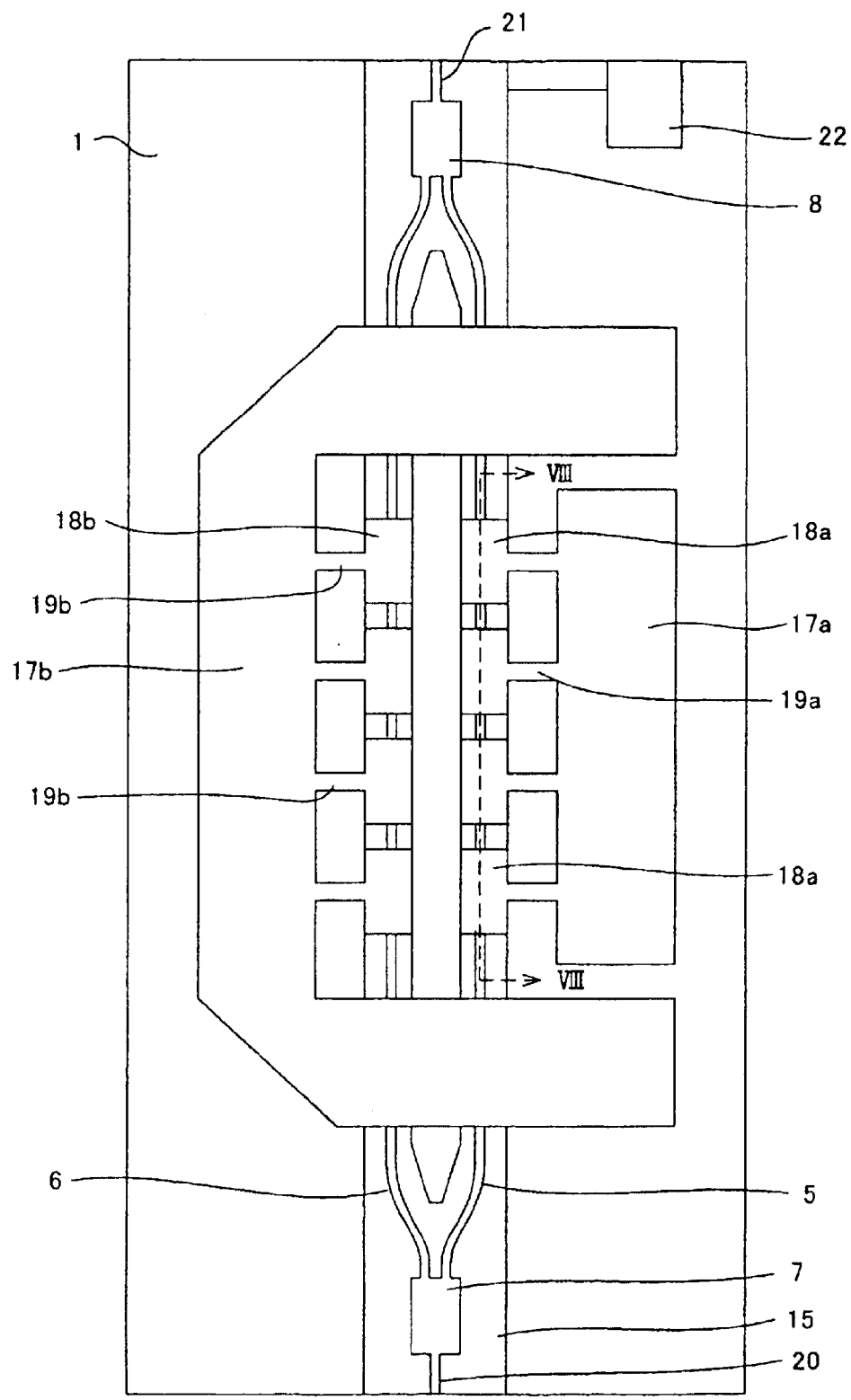
FIG. 23 is a top view of a semiconductor optical modulator according to a second embodiment of the present invention.
Figure 24:
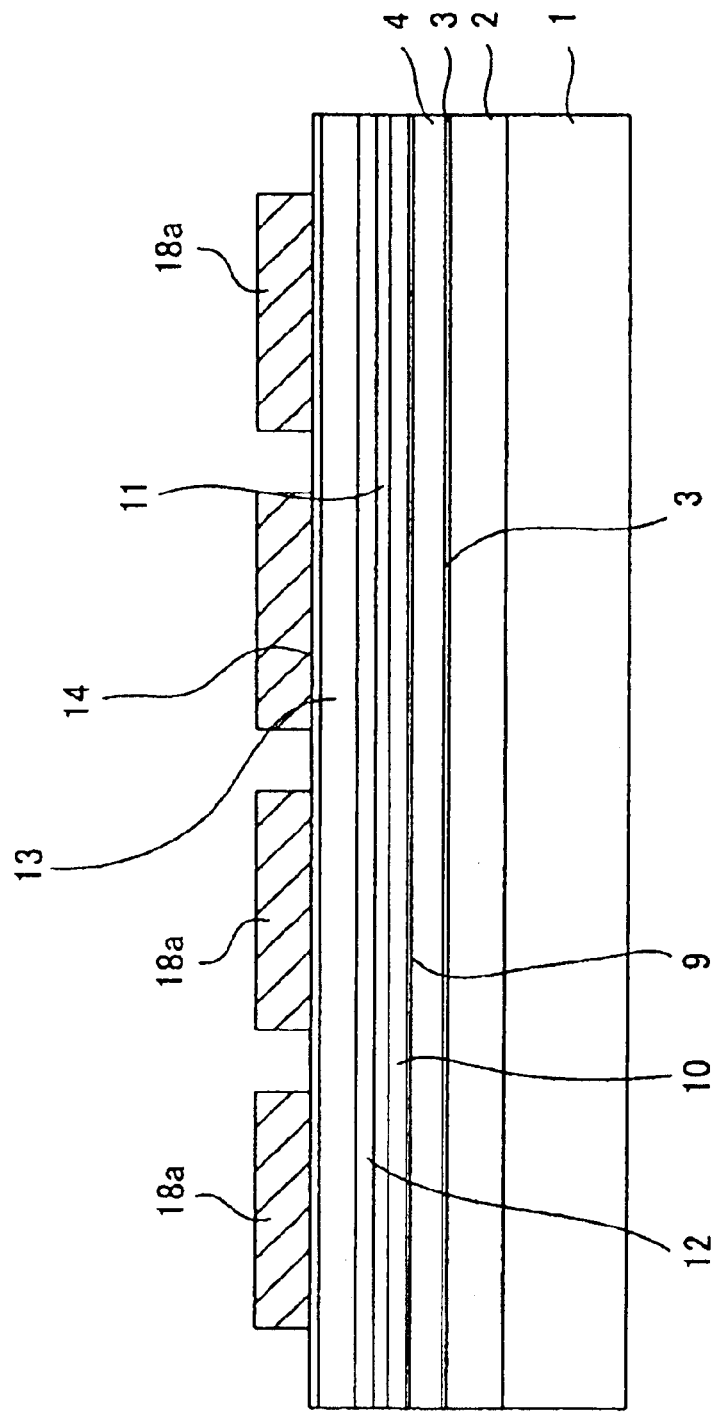
FIG. 24 is a sectional view of the semiconductor optical modulator according to the second embodiment of the present invention.

FIG. 23 is a plane view showing a semiconductor optical modulator according to a second embodiment of the present invention. FIG. 24 is a sectional view that is viewed along a VIII—VIII line in FIG. 23. In FIG. 23 and FIG. 24, the same symbols as those in FIG. 6 to FIG. 10 denote the same elements.

In the semiconductor optical modulator according to the second embodiment, the i-InP layer 12, the p-InP layer 13, and the p-InGaAs layer 14 are formed uniformly on or over the i-MQW core layers 11 of the first to fourth optical waveguides 5, 6, 20, 21 and the first and second MMI optical couplers 7, 8 constituting the Mach-Zehnder interferometer along the direction parallel with the optical axis.

In other words, the i-InP layer 12, the p-InP layer 13, and the p-InGaAs layer 14 are formed in the spaces between a plurality of phase modulation electrodes 18a, 18b, which are formed at a distance on an upper surface of the p-InGaAs layer 14, to leave no spaces therebetween.

Therefore, the SI-InP layer 15 shown in the first embodiment is not formed in the areas in which the phase modulation electrodes 18a, 18b are not formed, but such SI-InP layer 15 is formed only on both sides of the optical waveguides 5, 6, 20, 21 and the MMI optical couplers 7, 8. The second embodiment has a different structure from the first embodiment at this point. The other structures are similar to those in the first embodiment.

The steps of manufacturing the semiconductor optical modulator according to the present embodiment are almost similar to those in the first embodiment. However, in the case of the present embodiment, re-growing steps by the MOVPE method shown in FIG. 13 and FIG. 18 are omitted. Therefore, the optical modulator according to the present embodiment is superior in simplicity of manufacture to the optical modulator according to the first embodiment.

In this case, in the present embodiment, the i-InP layer 12, the p-InP layer 13, and the p-InGaAs layer 14 are formed uniformly in the areas in which the phase modulation electrodes 18a, 18b are not formed. For this reason, an energy loss of the high-frequency electric signal is caused in this portion.

Therefore, according to the optical modulator of the present embodiment, a frequency band of the traveling-wave electrode can be reduced rather than the structure in which the spaces between a plurality of phase modulation electrodes 18a, 18b are buried by the SI-InP layer. However, the cross section of the phase modulator portion has the same structure as the cross section shown in FIG. 7 and thus the widths of i-MQW layer 11 and its upper and lower layers are reduced. Therefore, such an advantage can be obtained that the energy loss of the high-frequency electric signal is small in contrast to the prior art.

Third Embodiment

Figure 25:
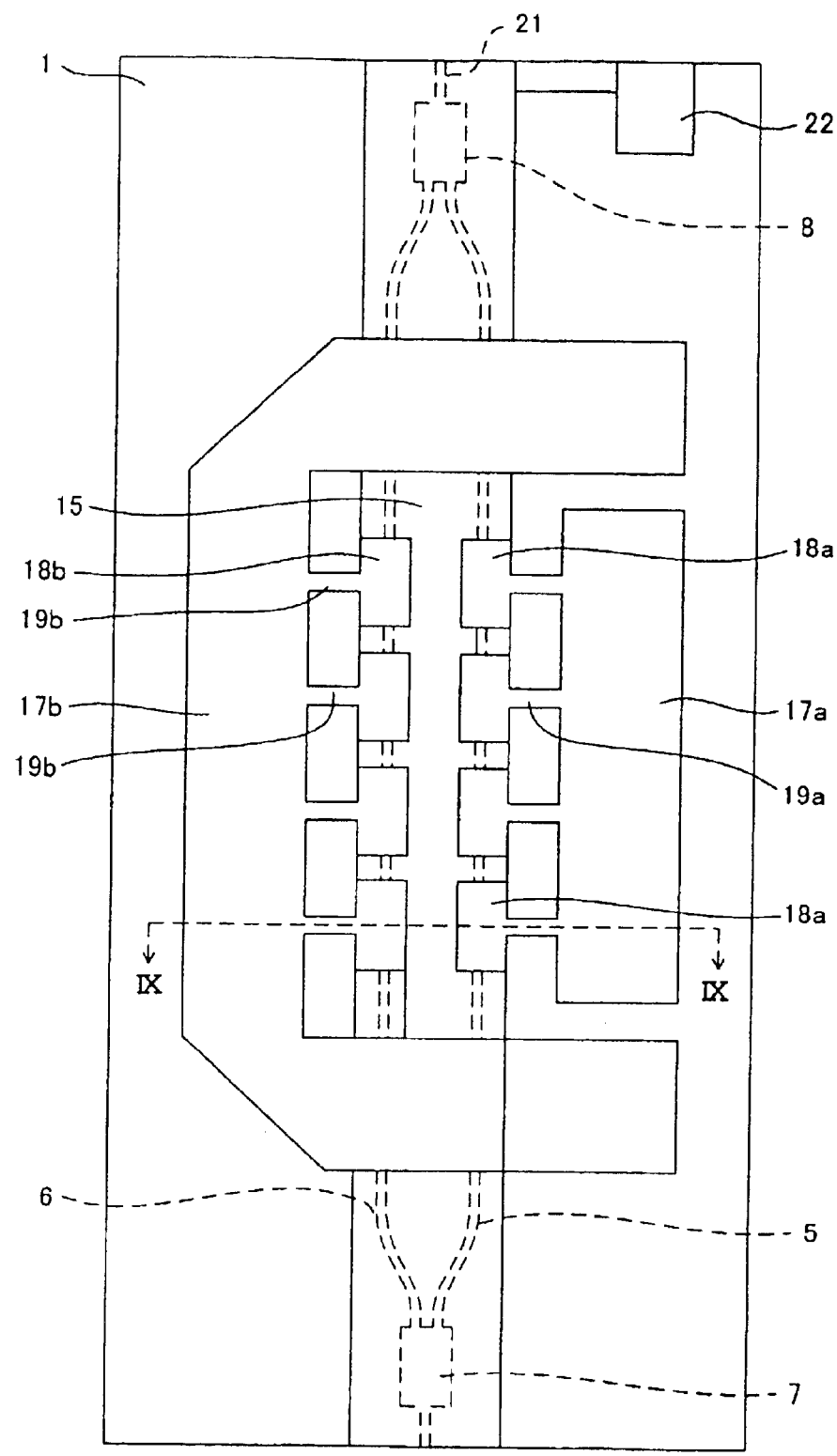
FIG. 25 is a top view of a semiconductor optical modulator according to a third embodiment of the present invention.
Figure 26:
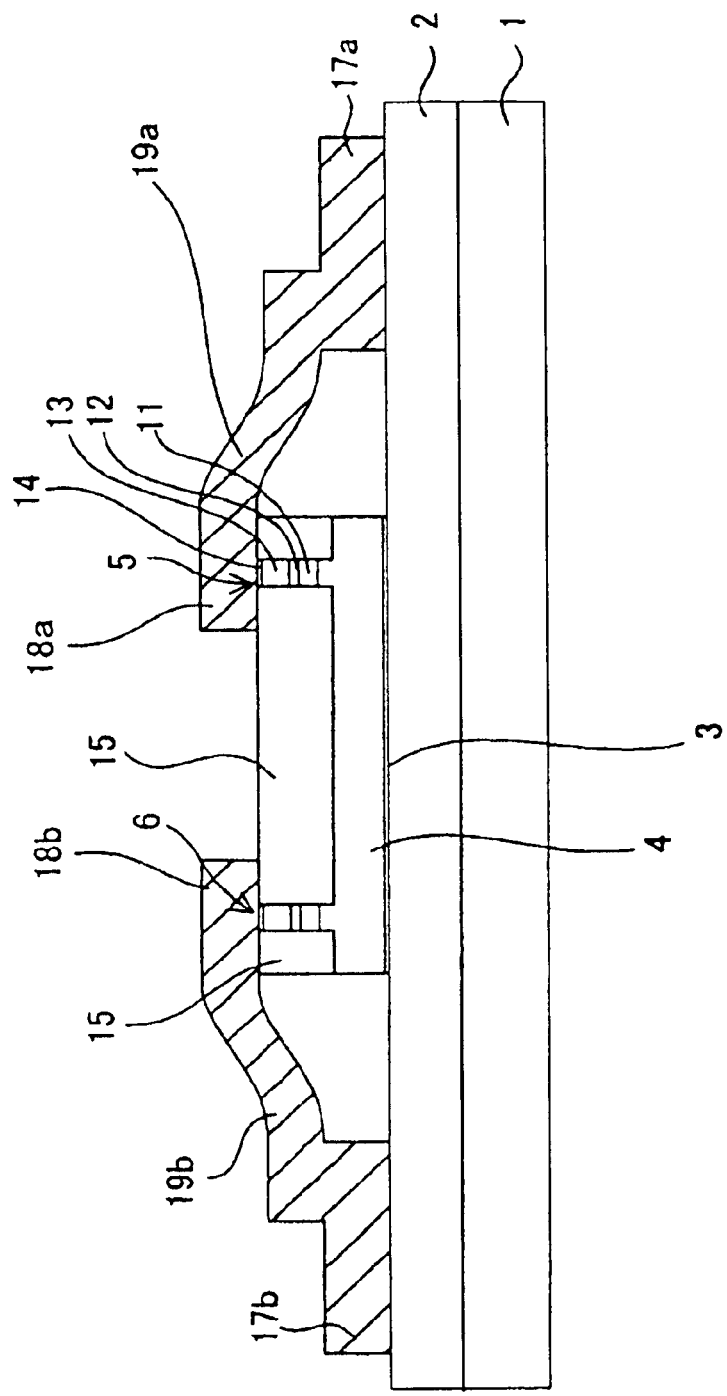
FIG. 26 is a sectional view of the semiconductor optical modulator according to the third embodiment of the present invention.

FIG. 25 is a plane view showing a semiconductor optical modulator according to a third embodiment of the present invention. FIG. 26 is a sectional view that is viewed along a IX—IX line in FIG. 25. In FIG. 25 and FIG. 26, the same symbols as those in FIG. 6 to FIG. 10 denote the same elements.

In the semiconductor optical modulator of the present embodiment, the SI-InP layer 15 between the i-MQW layers 11 of the first and second optical waveguides 5, 6 that constitute the Mach-Zehnder interferometer is not separated in areas between them and is formed continuously. A height position of the upper surface of the SI-InP layer 15 almost coincides with that of the upper surface of the p-InGaAs layer 14 over the i-MQW layers.

The steps of the manufacturing method in the third embodiment are almost similar to those in the first embodiment. However, in the case of the present embodiment, in the wet etching step explained with reference to FIG. 17 and FIG. 22 in the first embodiment, the SI-InP layer 15 between the i-MQW core layers 11 of two optical waveguides 5, 6 is not removed but still left as it is. Then, the SI-InP layer 15 on both side of the n-InP bias layer 4 is removed when the n-InP bias layer 4 under the DC bias electrode pad 22 is to be exposed.

In this manner, in the present embodiment, removal of the SI-InP layer 15 in the areas between the i-MQW core layers 11 of two optical waveguides 5, 6 is not needed. Therefore, the third embodiment is superior to the first embodiment in a respect of simplicity of manufacture.

Also, in the present embodiment, a flat surface extends over the relatively wide range that is obtained by upper surfaces of the p-InGaAs layers 14 over respective i-MQW layers of two optical waveguides 5, 6 and the upper surface of the SI-InP layer 15 put between them. In this manner, since the planarity around the upper surfaces of the p-InGaAs layers 14 is good, the alignment margin of such area can be increased. As a result, the Au-plating applied to such area can be relatively easily formed, and thus the manufacturing advantage can be achieved.

In this case, in the present embodiment, the InGaAsP etch-stop layer 9 is not formed between the n-InP bias layer 4 and the i-MQW layer 11.

Fourth Embodiment

Figure 27:
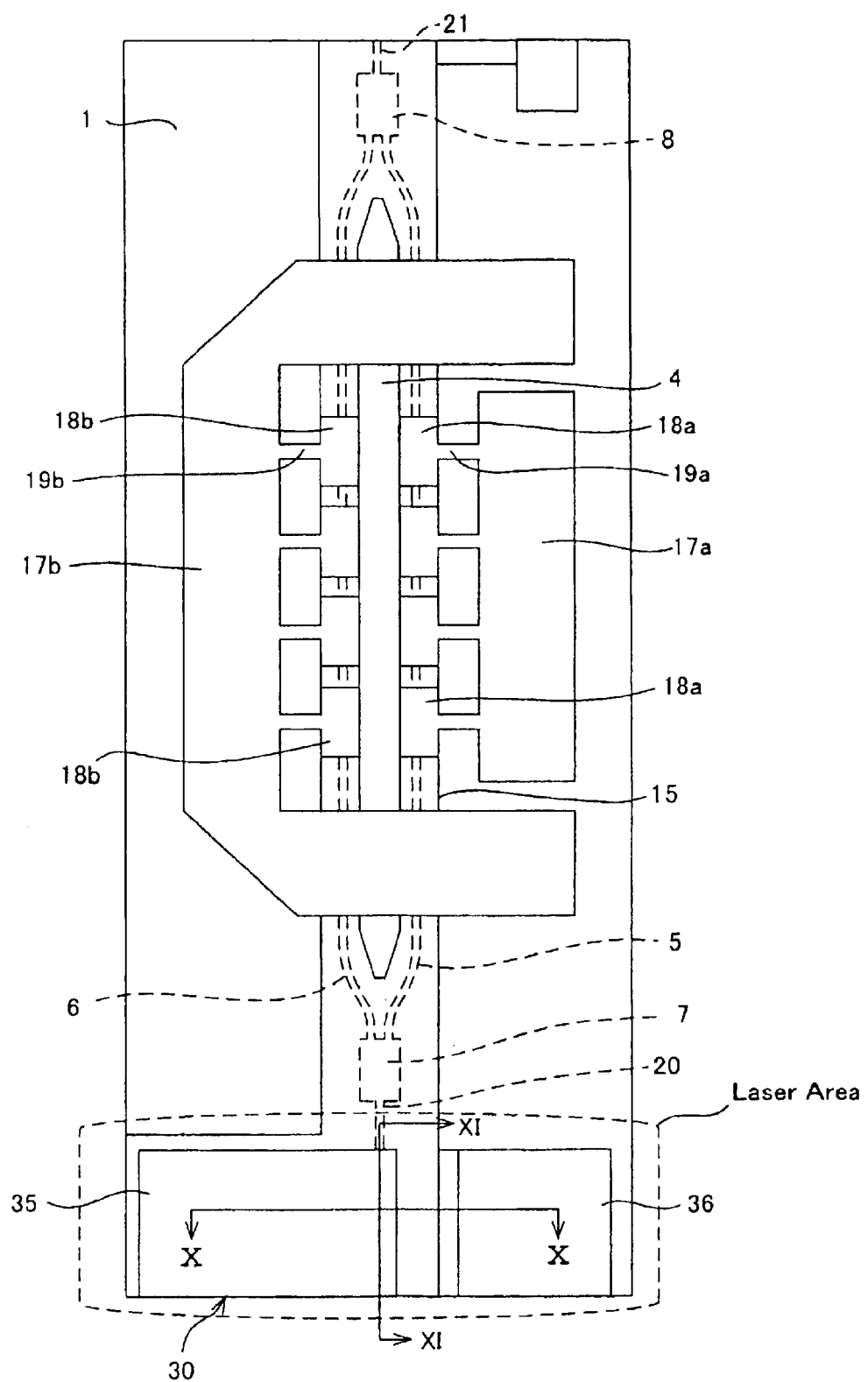
FIG. 27 is a top view of a semiconductor optical modulator according to a fourth embodiment of the present invention.
Figure 28:
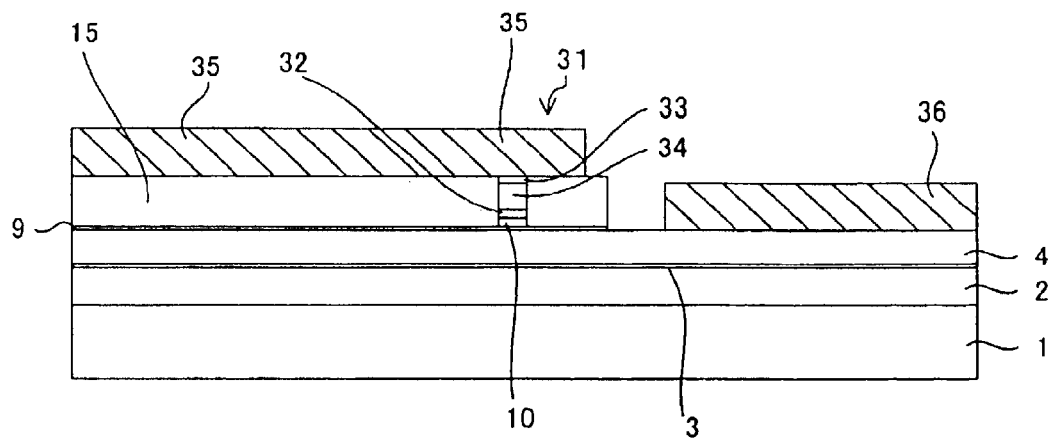
FIG. 28 is a first sectional view of the semiconductor optical modulator according to the fourth embodiment of the present invention.
Figure 29:
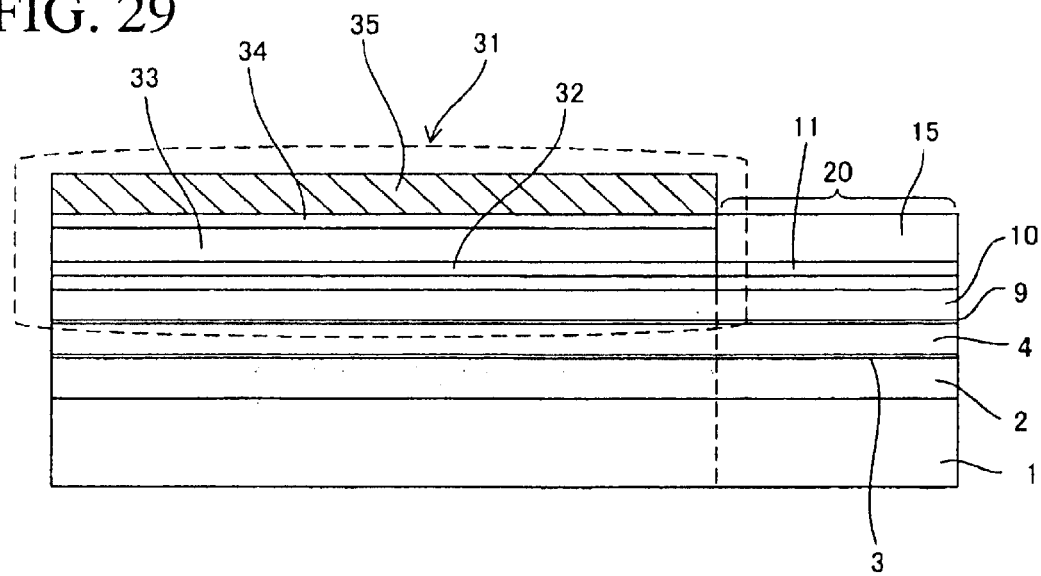
FIG. 29 is a second sectional view of the semiconductor optical modulator according to the fourth embodiment of the present invention.

FIG. 27 is a plane view showing a semiconductor optical modulator according to a fourth embodiment of the present invention. FIG. 28 is a sectional view that is viewed along a X—X line in FIG. 27, and FIG. 29 is a sectional view that is viewed along a XI—XI line in FIG. 27. In FIG. 27 to FIG. 29, the same symbols as those in FIG. 6 to FIG. 10 denote the same elements.

In the fourth embodiment, a device structure is formed by integrated the semiconductor optical modulator explained up to now and the semiconductor laser therein.

In FIG. 27, a semiconductor laser 31 is connected to a light incident end of the third optical waveguide 20 that is connected to the first MMI optical coupler 7. Also, unlike the above embodiments, the DC bias electrode pad is formed as an n-side electrode of the semiconductor laser 31 on the side of the third optical waveguide 20.

As shown in FIGS. 28 and 29, in the semiconductor laser, an MQW active layer 32 is formed over the n-InP bias layer 4 at the almost same height as the i-MQW layers 11 of two optical waveguides 5, 6.

In this case, the luminous wavelength of the MQW active layer 32 in the semiconductor laser 31 is adjusted around 1.55 µm, and such MQW active layer is formed to have different composition and structure from those of the i-MQW layer 11 in the modulator area.

Although omitted from FIG. 28 and FIG. 29, a diffraction grating is formed on or under the MQW active layer 32 in the semiconductor laser 31, like the normal distributed feedback (DFB) laser. The composition of the MQW active layer 32 and the shape of the diffraction grating are adjusted respectively such that the oscillation wavelength of this DFB laser is set to 1.55 µm.

In the semiconductor laser 31, a p-InP clad layer 33 and a p-InGaAs layer 34 are formed on or over the MQW active layer 32. The n-InP layer 10, the InGaAsP etch-stop layer 3, and the n-InP bias layer 4, which are extended from the area under the i-MQW layer 11 of the third waveguide 20, are formed under or below the MQW active layer 32. Respective layers from the n-InP layer 10 to the p-InGaAs layer 34 are formed like a stripe. Then, the SI-InP layer 15 is formed on both sides of these layers.

A p-side electrode 35 is formed on the p-InGaAs layer 34 and the SI-InP layer 15 of the semiconductor laser 31 by the Au-plating. The p-side electrode 35 is the DC bias electrode pad.

Also, the n-InP layer 10, the InGaAsP etch-stop layer 3, and the n-InP bias layer 4 of the semiconductor laser 31 are extended to the lateral direction with respect to the light traveling direction. Then, an n-side electrode 36 for a DC bias is formed on their upper surfaces by the Au-plating, like the upper surfaces of the p-InGaAs layers 14 of the optical waveguides 5, 6. This n-side electrode 36 also functions as the DC bias electrode pad 22 in the above embodiments.

In this case, the n-InP layer 10 formed under the MQW active layer 32 functions as the n-type clad layer.

Figure 30:
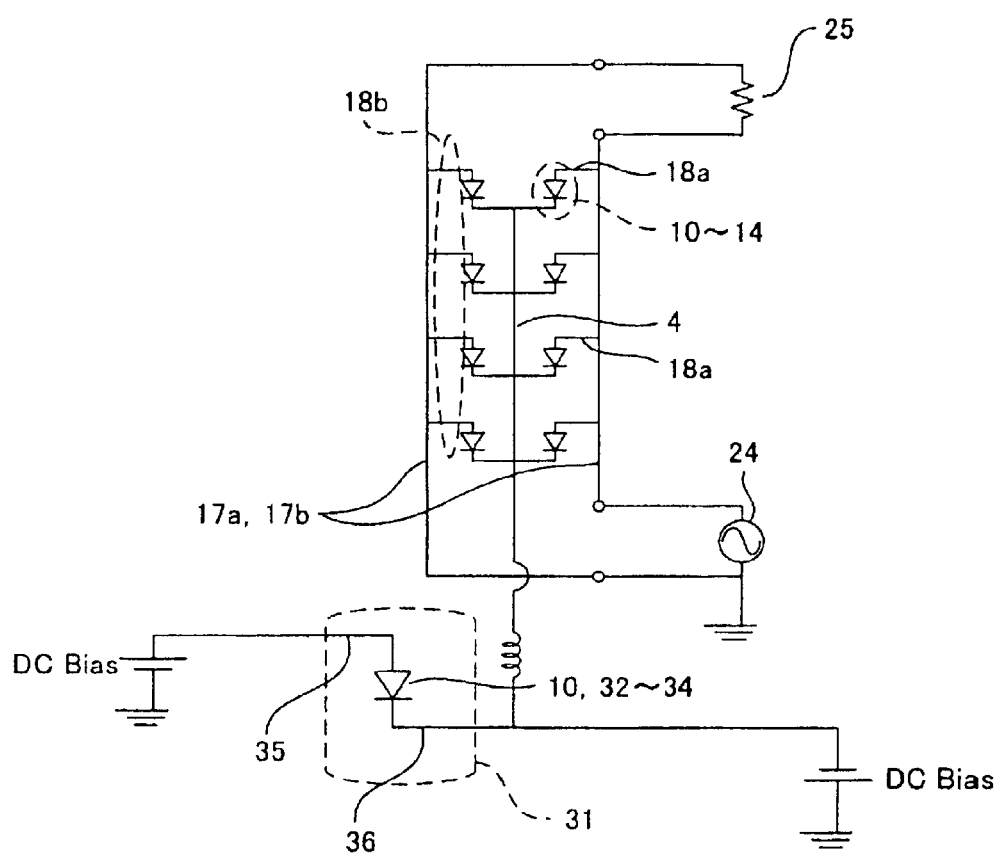
FIG. 30 is an equivalent driving circuit diagram of the semiconductor optical modulator according to the fourth embodiment of the present invention.

An equivalent driving circuit of the laser-integrated semiconductor optical modulator in the fourth embodiment is shown in FIG. 30.

A DC bias voltage is applied to the n-side electrode 36 for the DC bias on the upper surface of the n-InP bias layer 4 constituting a part of the semiconductor laser 31, and then the n-side electrode 36 is held at a potential different from the ground potential. This potential is transmitted to the lower surface of the i-MQW layer 11 in the modulator area via the n-InP bias layer 4 located below the MQW active layer 32. This potential value is adjusted to maximize an extinction ratio of the present device at the operation of optical modulation. That is, in the first embodiment, such potential value becomes substantially equal to the potential that is applied to the DC bias electrode pad 22.

Meanwhile, in the semiconductor laser 31, the potential that is applied to the p-side electrode 35 formed on the p-InGaAs layer 34 is adjusted to a value at which an optical output obtained from the semiconductor laser 31 can be set to a desired power. That is, such potential is set to a value that is obtained by adding the voltage, which is required to drive the semiconductor laser 31 as a single body, to the potential that is applied to the n-side electrode 36 on the n-InP bias layer 4.

In the present embodiment, since the semiconductor laser 31 serving as a light source and the optical modulator for data-modulating the laser beams are integrated together, such an advantage can be achieved that a light transmitting module constructed by them becomes compact in size. Also, since the MQW optical waveguide and the MQW active layer, both having the almost same shape, are optically coupled by the butt joint, such an advantage can be achieved that a coupling loss between them becomes small.

Fifth Embodiment

Figure 31:
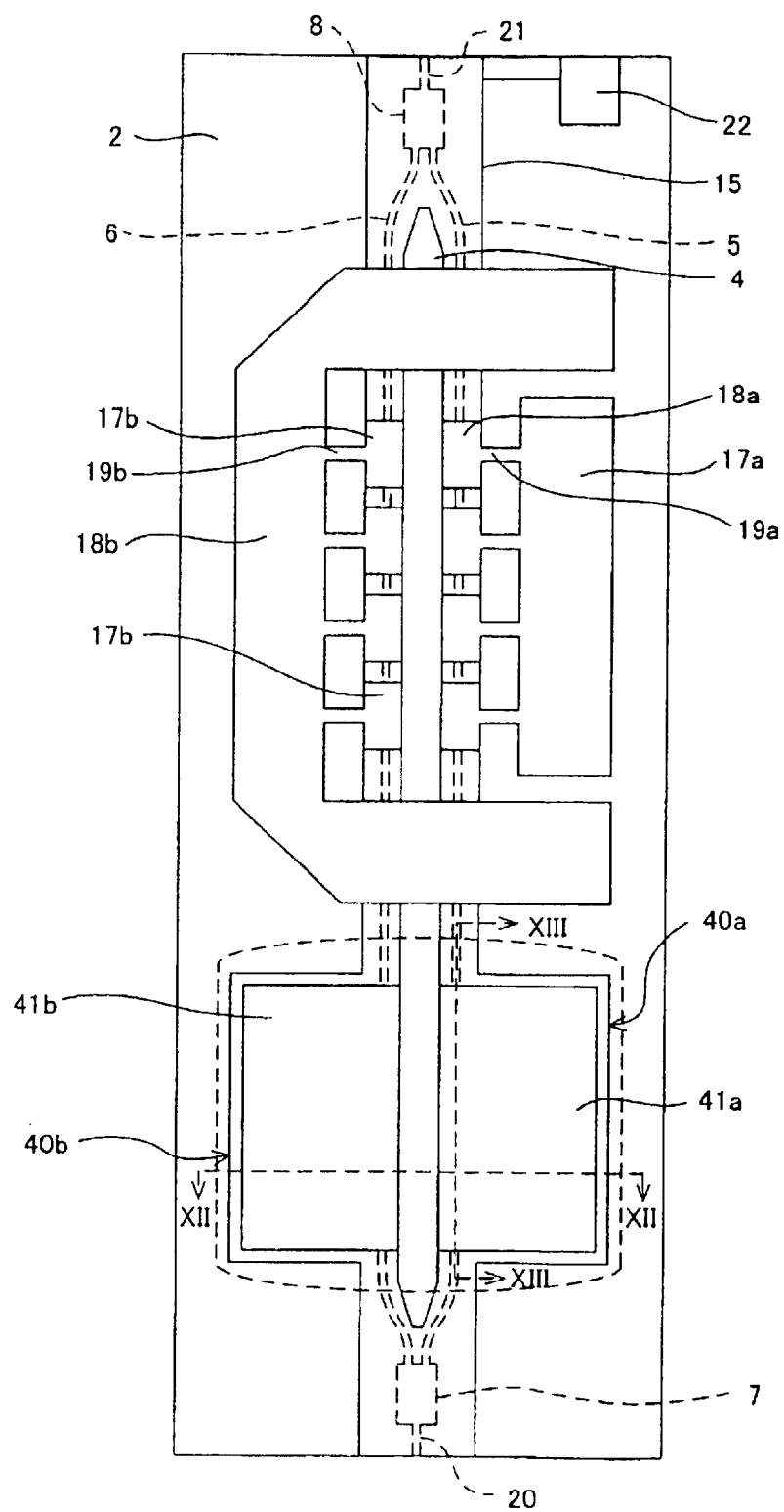
FIG. 31 is a top view of a semiconductor optical modulator according to a fifth embodiment of the present invention.
Figure 32:
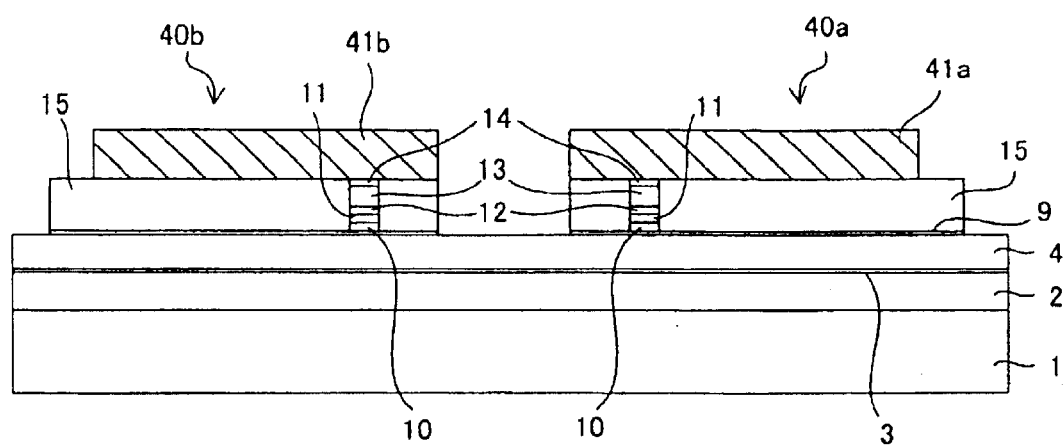
FIG. 32 is a first sectional view of the semiconductor optical modulator according to the fifth embodiment of the present invention.
Figure 33:
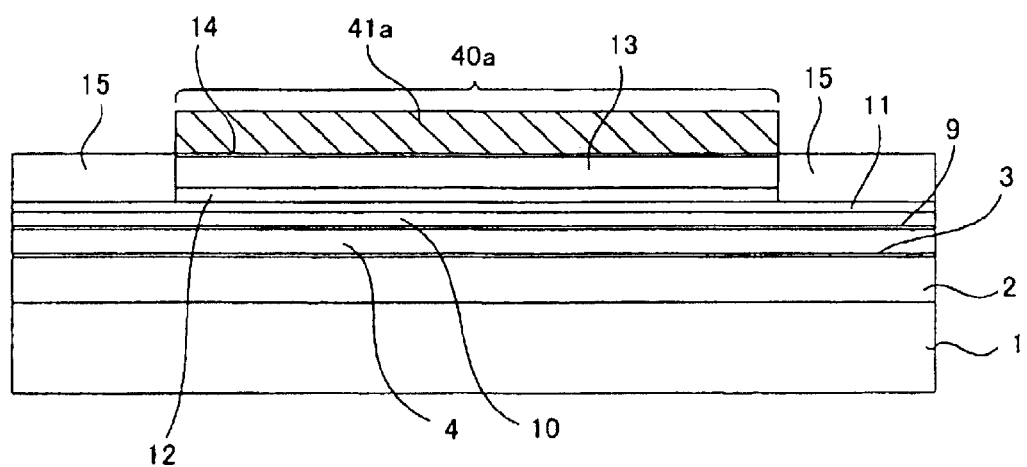
FIG. 33 is a second sectional view of the semiconductor optical modulator according to the fifth embodiment of the present invention.

FIG. 31 is a plane view showing a semiconductor optical modulator according to a fifth embodiment of the present invention. FIG. 32 is a sectional view that is viewed along a XII—XII line in FIG. 31, and FIG. 33 is a sectional view that is viewed along a XIII—XIII line in FIG. 31. In FIG. 31 to FIG. 33, the same symbols as those in FIG. 6 to FIG. 10 denote the same elements.

In the present embodiment, a device structure in which phase-difference adjusting areas are integrated with the semiconductor optical modulator explained up to now in the present invention is employed.

In FIG. 31, phase-difference adjusting areas 40a, 40b are arranged on the light incident side rather than the phase modulation electrodes 18a, 18b of the first and second optical waveguides 5, 6.

In the phase-difference adjusting areas 40a, 40b, as shown in FIG. 32 and FIG. 33, the i-InP layer 12, the p-InP layer 13, and the p-InGaAs layer 14 are formed sequentially on respective i-MQW layers 11 of two optical waveguides 5, 6 constituting the Mach-Zehnder interferometer. That is, layer structures of the phase-difference adjusting areas 40a, 40b have the same structure as that under the phase modulation electrodes 18a, 18b of the optical waveguides. As a result, in the phase-difference adjusting areas 40a, 40b, the upper surface of the p-InGaAs layer 14 is set to a same height as the upper surfaces of the SI-InP layers 15 on both sides of the p-InGaAs layer 14.

Also, lengths of the i-InP layer 12, the p-InP layer 13, and the p-InGaAs layer 14 in the direction parallel with the optical axis in two phase-difference adjusting areas 40a, 40b are set to about 100.0 to 350.0 µm by the patterning.

In addition, in two phase-difference adjusting areas 40a, 40b, the n-InP layer 4, the InGaAsP etch-stop layer 3, and the SI-InP layer 15 are formed to expand into the outside of the optical waveguides 5, 6 respectively. Then, DC bias electrode pads for phase-difference adjustment 41a, 41b are formed on the SI-InP layer 15 and the p-InGaAs layer 14 in two phase-difference adjusting areas 40a, 40b respectively. In other words, two phase-difference adjusting DC bias electrode area pads 41a, 41b are formed toward the outside from areas over respective i-MQW layers 11 of two optical waveguides 5, 6 to spread over the wide area.

The SI-InP layer 15 is formed on the i-MQW layers 11 in front and rear areas in which the DC bias electrode pads for phase-difference adjustment 41a, 41b are formed. Accordingly, such areas in which the DC bias electrode pads for phase-difference adjustment 41a, 41b are isolated electrically from the phase modulation areas in which the traveling-wave phase modulation electrodes 18a, 18b are formed.

In this case, in the optical modulator according to the present embodiment, structures except the phase-difference adjusting areas 40a, 40b are formed as the same structures as those in the semiconductor optical modulator in the first embodiment.

Figure 34:
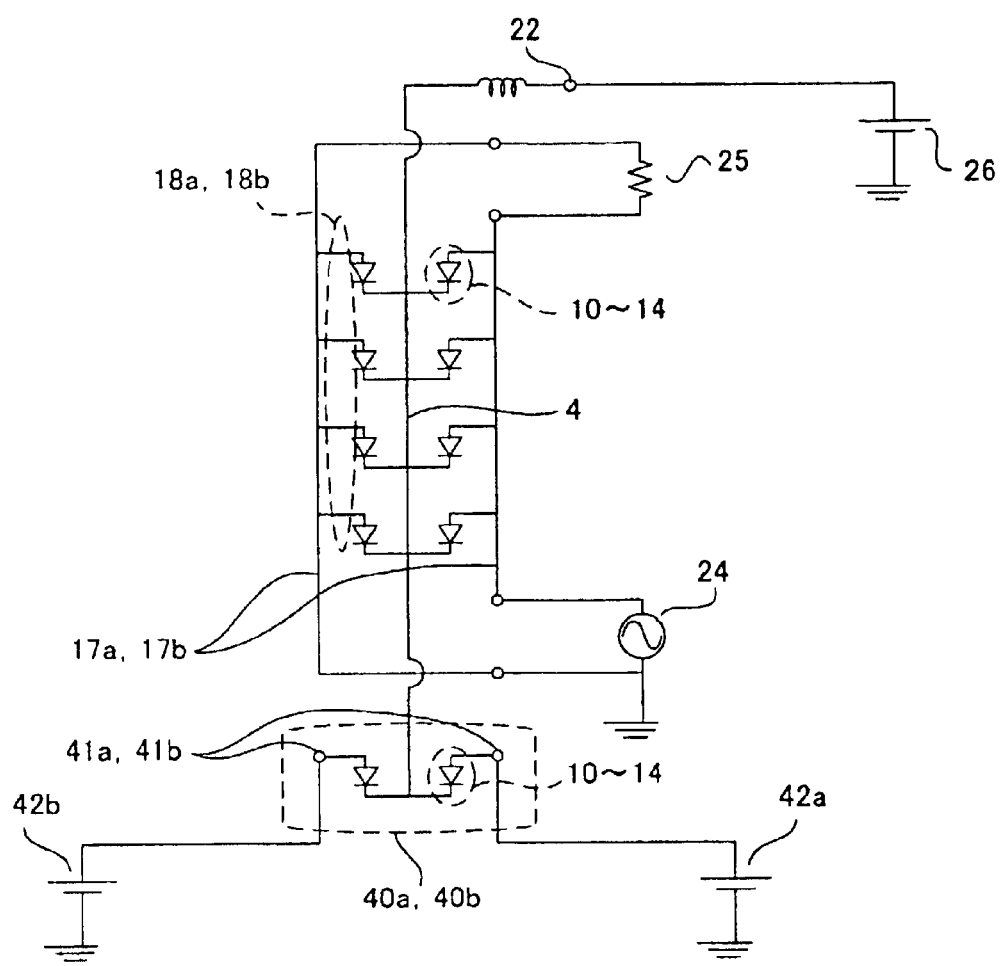
FIG. 34 is an equivalent driving circuit diagram of the semiconductor optical modulator according to the fifth embodiment of the present invention.

FIG. 34 is an equivalent driving circuit of the semiconductor optical modulator according to the present embodiment.

Different DC bias voltages are applied to the DC bias electrode pads 41a, 41b respectively, and then held at different potentials from the ground potential. These potentials are adjusted such that the optical output can be maximized in the state that the device is not extinguished when the optical modulation operation is carried out by driving the device, i.e., in the ON state of the light.

Next, functions of the DC bias electrode pads for phase-difference adjustment 41a, 41b in the present embodiment will be explained hereunder.

When the semiconductor optical modulator explained up to now in the present invention is to be driven, only the electric field generated by the DC bias potential, which is supplied to the DC bias electrode pad 22 on the n-InP bias layer 4, is applied to the i-MQW layers (core layers) 11 of the first and second optical waveguides 5, 6 constituting the Mach-Zehnder interferometer, in the ON state of the light. The intensity of the electric field is identical between two optical waveguides 5, 6. In this case, since the light being guided through these optical waveguides 5, 6 is subjected to the same phase modulation, the light is not extinguished and the ON state is generated.

However, structural difference is actually caused between two optical waveguides 5, 6 due to variation in manufacture. Therefore, phases of the lights that are guided through two arms do not coincide with each other even in the ON state of the light.

As a result, the interference of the light is caused based on this phase difference to reduce a power of the output light, so that degradation of an extinction ratio is brought about. Here, in the present embodiment, if different potentials are applied to the DC bias electrode pads for phase-difference adjustment 41a, 41b of two optical waveguides 5, 6 respectively, it is possible to generate different phase changes in the lights that are guided through two optical waveguides 5, 6 in this area. Thus, if phase changes are adjusted by changing the potentials, it is possible to cancel the phase difference between the guided lights, which are generated in the phase modulator portions because of above variation in manufacture in the ON state of the light.

As a result, in the present embodiment, reduction in the output power can be prevented in the ON state of the light, and thus an extinction ratio can be set largely.

Here, there are two ways of setting the potential applied to the DC bias electrode pads for phase-difference adjustment 41a, 41b such that such potential is set larger or smaller than the potential applied to the DC bias electrode pad 22 that is connected to the n-InP bias layer 4.

In the former, a substantial current flows from the DC bias electrode pads for phase-difference adjustment 41a, 41b to the DC bias electrode pad 22 on the n-InP bias layer 4. In this case, carrier densities in respective i-MQW (core) layers 11 of the optical waveguides 5, 6 are changed in response to an quantity of current. The refractive indexes in the core layers are changed according to this, and thus the phase of the guided light can be adjusted.

In the latter, the substantial electric field generated by the reverse bias voltage is applied to the inner sides of the i-MQW layers 11. In this case, the phase difference can also be adjusted by the change in the refractive index induced by the electric field.

In the former case, there is such an advantage that, even though areas of the phase-difference adjusting areas 40a, 40b are set relatively small, the desired phase change can be obtained. However the power consumption to supply the current and the heat generation caused by such power consumption becomes problems. In the latter case, lengths of the phase-difference adjusting areas 40a, 40b in the light traveling direction must be set relatively large. However there is such an advantage that no electric power consumption is caused. In the present embodiment, the desired one of these ways is used selectively.

Sixth Embodiment

Figure 35:
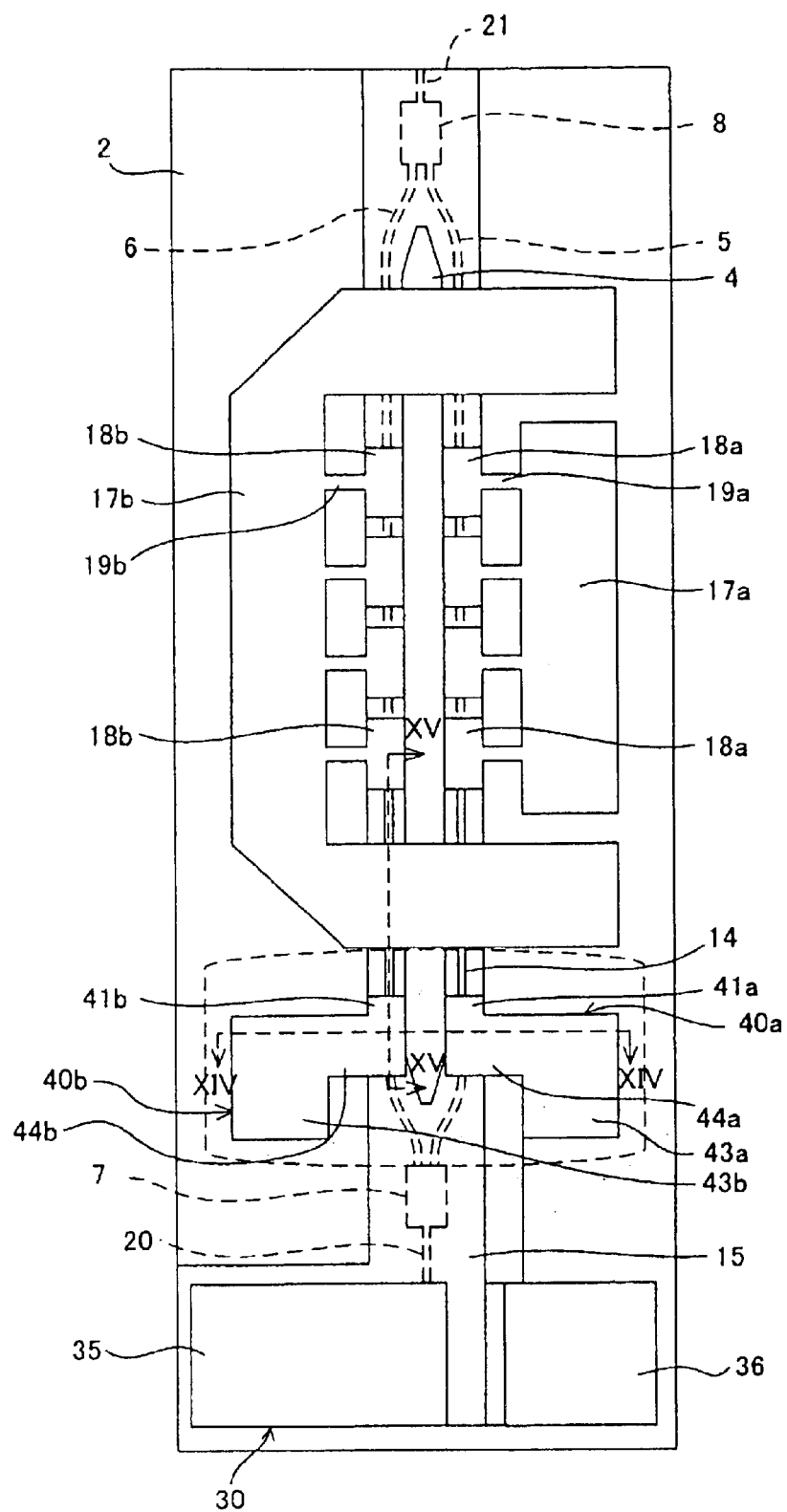
FIG. 35 is a top view of a semiconductor optical modulator according to a sixth embodiment of the present invention.
Figure 36:
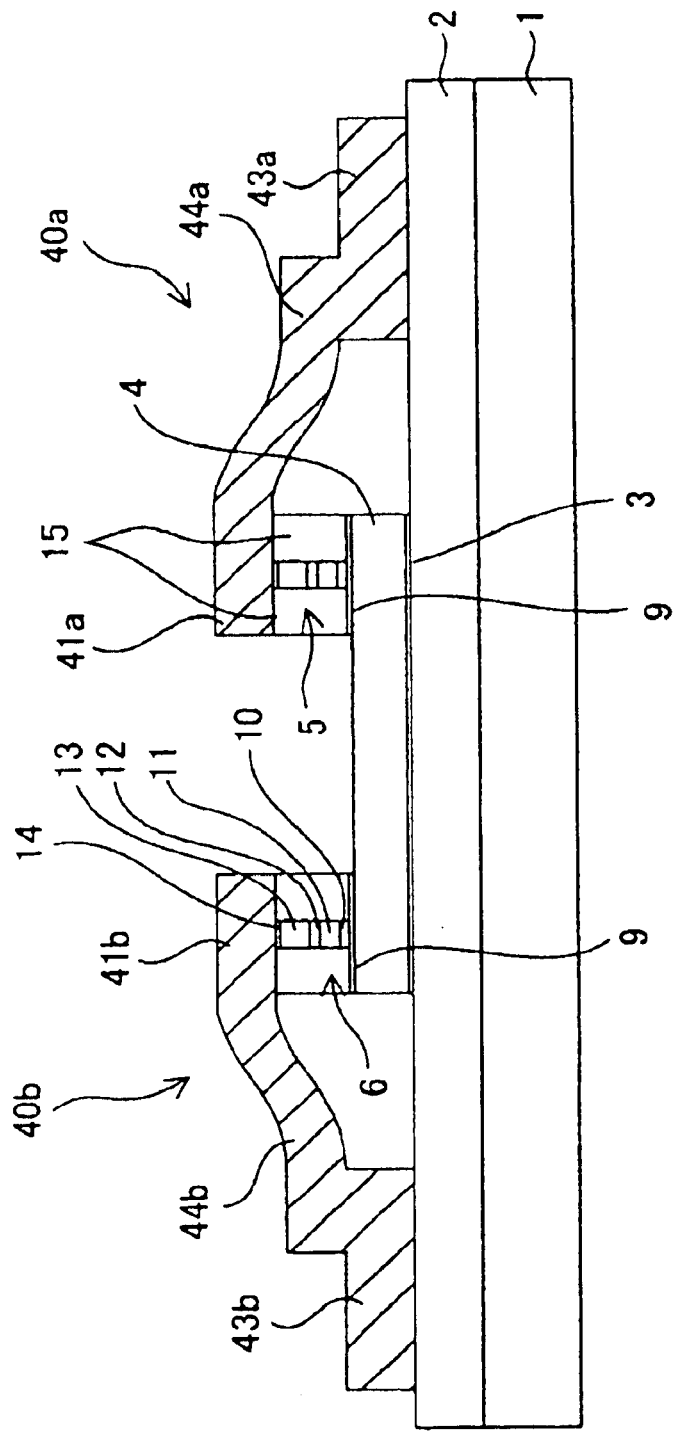
FIG. 36 is a first sectional view of the semiconductor optical modulator according to the sixth embodiment of the present invention.
Figure 37:
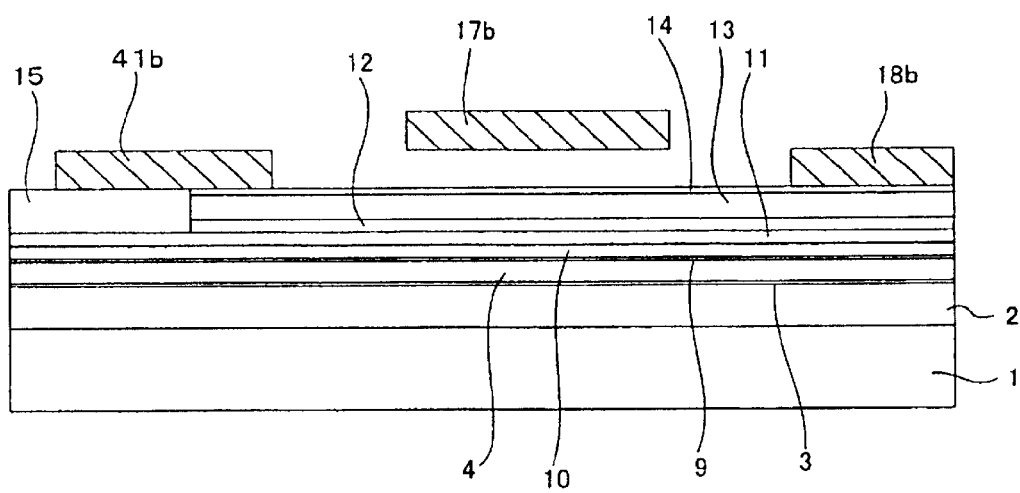
FIG. 37 is a second sectional view of the semiconductor optical modulator according to the sixth embodiment of the present invention.

FIG. 35 is a plane view showing a semiconductor optical modulator according to a sixth embodiment of the present invention. FIG. 36 is a sectional view that is viewed along a XIV—XIV line in FIG. 35, and FIG. 37 is a sectional view that is viewed along a XV—XV line in FIG. 35. In FIG. 35 to FIG. 37, the same symbols as those in FIG. 6 to FIG. 14 and FIG. 27 to FIG. 30 denote the same elements.

In the present embodiment, a device structure in which the phase-difference adjusting areas according to the fifth embodiment is integrated with the semiconductor-laser integrated semiconductor optical modulator according to the fourth embodiment is employed.

In FIG. 35, the phase-difference adjusting areas 40a, 40b are arranged in two optical waveguides 5, 6 constituting the Mach-Zehnder interferometer on the light incident side of respective phase-difference adjusting areas.

In the phase-difference adjusting areas 40a, 40b, the i-InP layer 12, the p-InP layer 13, and the p-InGaAs layer 14 are formed sequentially on or over the i-MQW layers 11 acting as the cores of the optical waveguides 5, 6. In addition, the DC bias electrode pads for phase-difference adjustment 41a, 41b for adjusting the phase difference are formed on the p-InGaAs layer 14 in the phase-difference adjusting areas 40a, 40b.

As shown in FIG. 37, the DC bias electrode pads for phase-difference adjustment 41a, 41b are connected to the lower p-InGaAs layer 14 by a length of 10.0 $\mu$m in the light traveling direction, and are formed on the SI-InP layer 15, which is formed over the i-MQW layers 11, on the light incident side therefrom. Also, lengths of the DC bias electrode pads for phase-difference adjustment 41a, 41b are set to about 30.0 $\mu$m in the direction that is parallel with the optical axis.

Also, as shown in FIG. 36, the DC bias electrode pads for phase-difference adjustment 41a, 41b are connected to wide electrode pads 43a, 43b, which are formed over the high-resistance InP substrate 1 separately on the outside of two optical waveguides 5, 6, via air bridge electrodes 44a, 44b.

The i-InP layer 12, the p-InP layer 13, and the p-InGaAs layer 14 located under or below the DC bias electrode pads for phase-difference adjustment 41a, 41b are formed continuously toward the semiconductor optical modulator portions, in which the traveling-wave phase modulation electrodes 18a, 18b of the device are formed, up to the under areas of the first phase modulation electrodes 18a, 18b. Respective distances between the first phase modulation electrodes 18a, 18b and the DC bias electrode pads for phase-difference adjustment 41a, 41b are 100.0 µm. Also, the air bridge portion of the slot-line electrode 17b having a width of 40.0 µm is formed over the area between the DC bias electrode pads for phase-difference adjustment 41a, 41b and the first phase modulation electrodes 18a, 18b to spread over the space. An interval of 30.0 µm is assured from both of the first phase modulation electrodes 18a, 18b and the DC bias electrode pads for phase-difference adjustment 41a, 41b to the air bridge portion of the slot-line electrode 17b respectively.

In this case, the first and second optical waveguides 5, 6 have the same structure as that in the first embodiment in areas from the phase adjusting area to the light traveling direction. The i-MQW layer 11 is buried in the SI-InP layer 15 in the areas in which the phase modulation electrodes 18a, 18b are not formed.

According to the above, the DC bias electrode pads for phase-difference adjustment 41a, 41b are connected electrically to the phase modulation electrodes 18a, 18b via the p-InGaAs layer 14. The semiconductor optical modulator has the same structure as the semiconductor-laser integrated semiconductor optical modulator according to the fourth embodiment except the phase-difference adjusting areas. In this case, the DC bias electrode pads for phase-difference adjustment 41a, 41b and the phase modulation electrodes 18a, 18b may be connected via metal wirings.

The functions of the phase-difference adjusting areas 40a, 40b in the sixth embodiment are similar to those of the fifth embodiment. That is, such functions are to cancel phase difference that is caused in the guided lights, which are guided through two optical waveguides 5, 6 in the phase modulator portions in the ON state of the light, due to the variation in manufacture. As a result, in the present embodiment, reduction in the output power in the ON state of the light can be prevented and thus the extinction ratio can be set largely.

Figure 38:
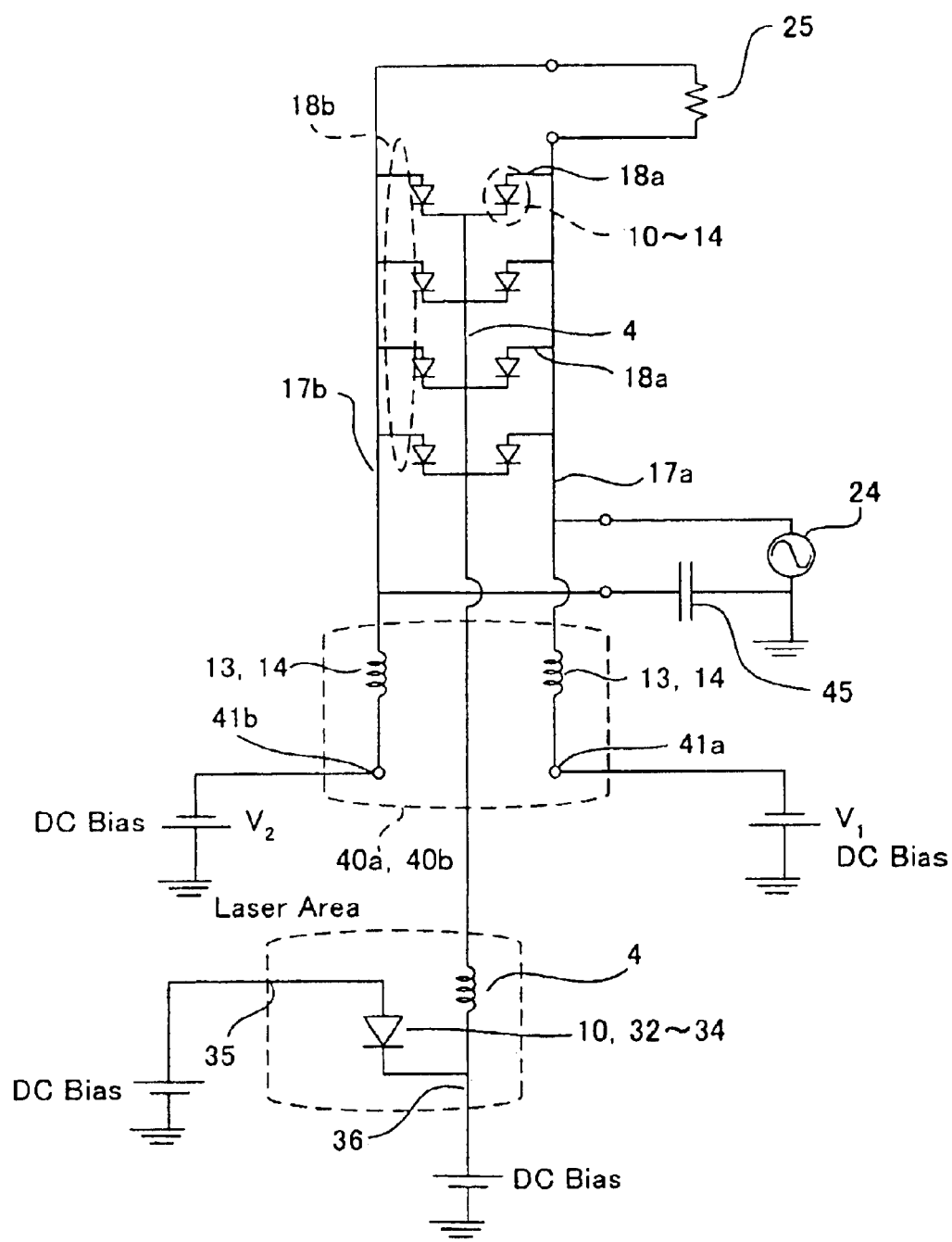
FIG. 38 is an equivalent driving circuit diagram of the semiconductor optical modulator according to the sixth embodiment of the present invention.
Figure 39:
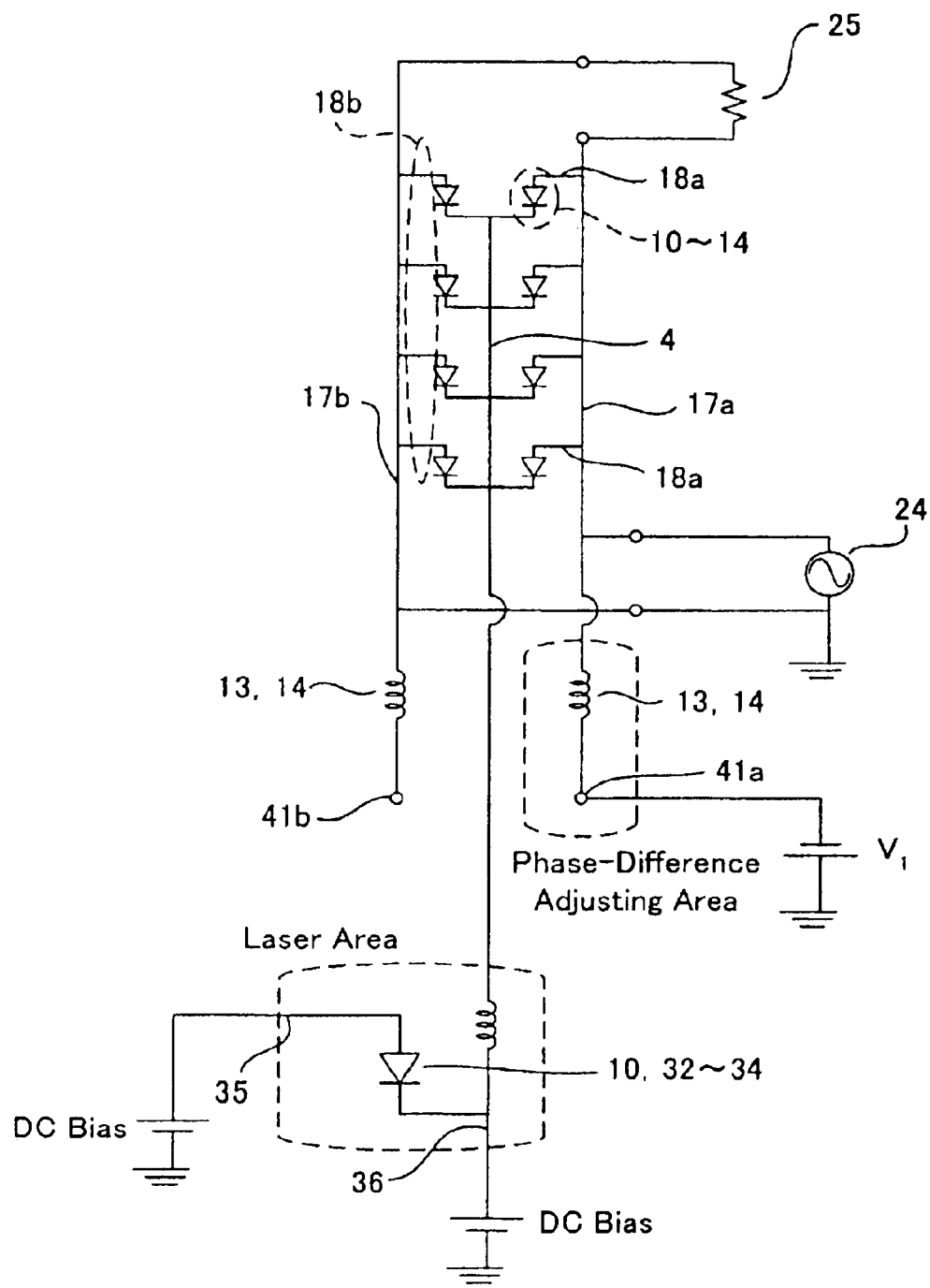
FIG. 39 is another equivalent driving circuit diagram of the semiconductor optical modulator according to the sixth embodiment of the present invention.

Two equivalent driving circuits of the semiconductor optical modulator in the present embodiment are shown in FIG. 38 and FIG. 39. In this case, in the phase-difference adjusting areas 40a, 40b in the sixth embodiment, since the p-InGaAs layer 14 to which the DC bias electrode pads for phase-difference adjustment 41a, 41b are connected is formed continuously up to the areas under the phase modulation electrodes 18a, 18b, the equivalent circuits of the phase-difference adjusting areas 40a, 40b are represented by inductances, unlike the equivalent driving circuit in the fifth embodiment in FIG. 34.

A first equivalent driving circuit of the semiconductor optical modulator according to the present embodiment is shown in FIG. 38. In this case, the phase difference between two optical waveguides 5, 6 can be adjusted by applying DC bias potentials $V_1$, $V_2$ to the DC bias electrode pads for phase-difference adjustment 41a, 41b formed independently in the phase-difference adjusting areas respectively. In this event, in order to prevent short-circuit between the DC bias potentials $V_1$, $V_2$ and the ground potential, a DC cutting filter 45 for cutting off a DC component is inserted between a ground line in the output portion of the high-frequency electric signal source 24 and the second slot-line electrode 17b.

A second equivalent driving circuit of the semiconductor optical modulator according to the present embodiment is shown in FIG. 39. In this case, out of two DC bias electrode pads for phase-difference adjustment 41a, 41b, only the pad that is not connected to the ground line of the high-frequency electric signal source 24 is used. Therefore, unlike the case in FIG. 38, the DC cutting filter 45 is not required.

In the case in FIG. 38, since the DC cutting filter 45 is required, the circuit configuration becomes complicated, however, the phases of two optical waveguides 5, 6 can be adjusted independently. Therefore, the potential applied in adjustment can be suppressed in a small range. In contrast, in the case in FIG. 39, the DC cutting filter 45 is not required and the phase-difference adjusting bias voltage is one system. Therefore, the circuit configuration becomes simple. On the contrary, since the phase difference must be adjusted by one system, a range of the potential applied in adjustment becomes large. In the sixth embodiment, the desired one of these systems is used selectively.

In both cases in FIG. 38 and FIG. 39, the potentials applied to the DC bias electrode pads for phase-difference adjustment 41a, 41b are adjusted such that the optical output can be maximized in the state that the device is not extinguished when the optical modulation operation is carried out by driving the device, i.e., in the ON state of the light.

Seventh Embodiment

Figure 40:
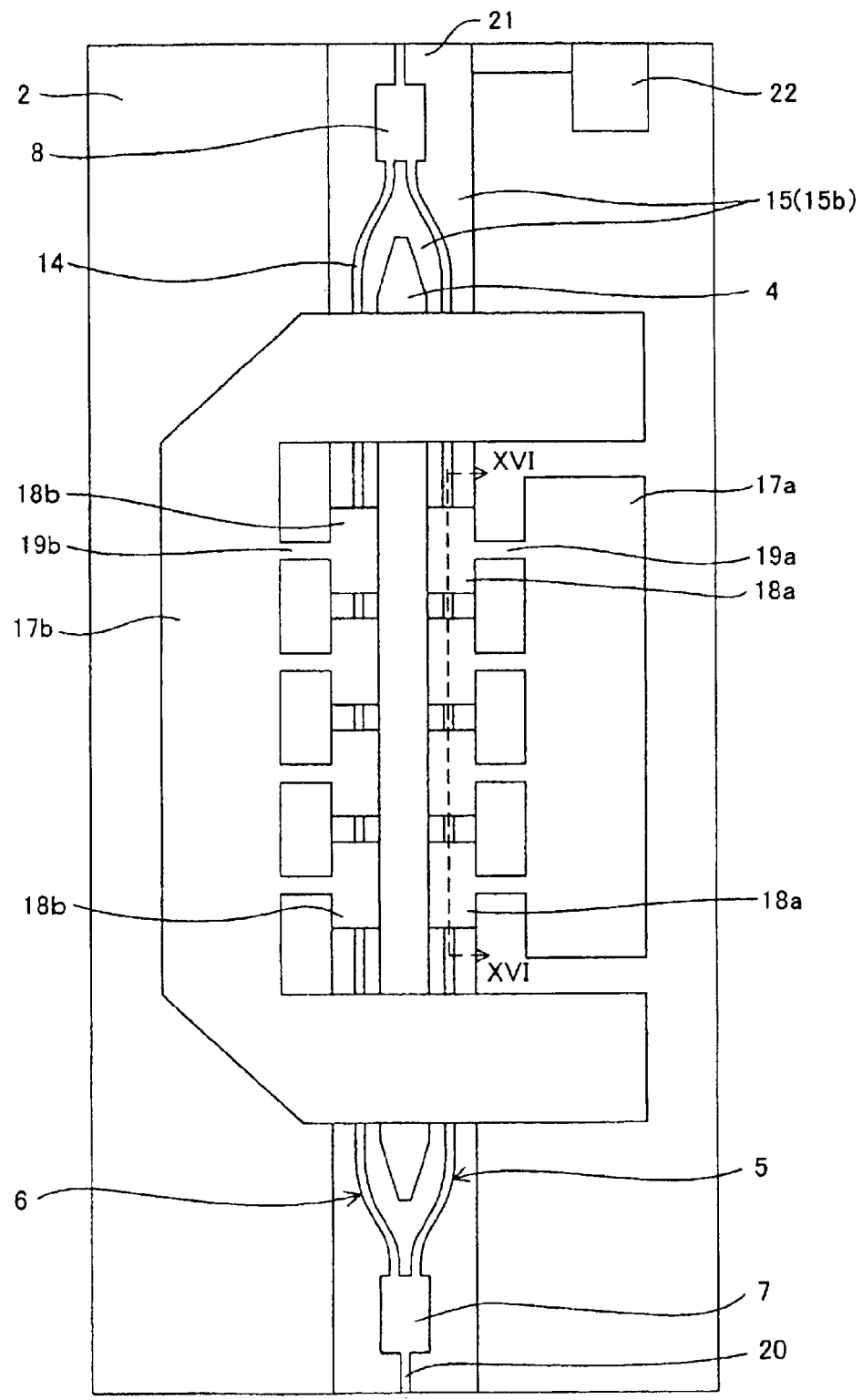
FIG. 40 is a top view of a semiconductor optical modulator according to a seventh embodiment of the present invention.
Figure 41:
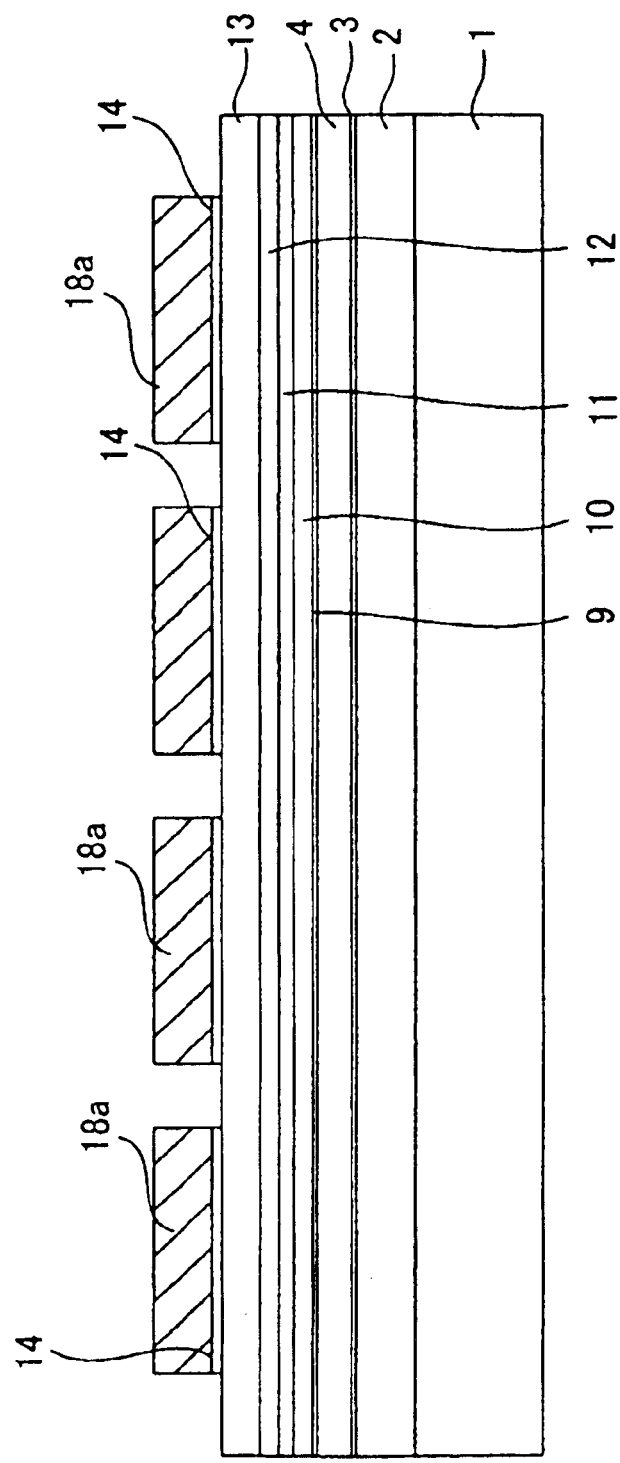
FIG. 41 is a sectional view of the semiconductor optical modulator according to the seventh embodiment of the present invention.

FIG. 40 is a plane view showing a semiconductor optical modulator according to a seventh embodiment of the present invention. FIG. 41 is a sectional view that is viewed along a XVI—XVI line in FIG. 40. In FIG. 40 and FIG. 41, the same symbols as those in FIG. 6 to FIG. 10 denote the same elements.

In the present embodiment, as can be seen from FIG. 41, the i-InP layer 12 and the p-InP layer 13 are formed uniformly on or over the i-MQW layers 11 of two optical waveguides 5, 6 constituting the Mach-Zehnder interferometer in the direction parallel with the optical axis. In contrast, in the first embodiment, the SI-InP layer is formed in place of the i-InP layer and the p-InP layer in the areas of the optical waveguides 5, 6, in which the phase modulation electrodes 18a, 18b are not formed.

Also, as shown in FIG. 40, the p-InGaAs contact layer 14 is formed only in the area that is positioned over the i-MQW core layer 11 and under the phase modulation electrodes 18a, 18b. This p-InGaAs contact layer 14 is removed from areas other than this area.

Other structures of the optical semiconductor device according to the present embodiment are identical to those of the optical semiconductor device shown in the first embodiment.

The method of manufacturing the optical semiconductor device according to the present embodiment is substantially similar to the first embodiment. In the case of the present embodiment, steps of forming the SI-InP layer 15a by the MOVPE regrowth shown in FIG. 13 and FIG. 18 are omitted. In other words, after the optical waveguides 5, 6 shown in FIG. 14 are formed, only the p-InGaAs contact layer 14 that exists in the areas except the area in which the phase modulation electrodes 18a, 18b are formed by later steps is etched selectively with respect to the lower p-InP layer 13. This etching is executed by the wet etching to remove selectively only the p-InGaAs contact layer 14 with respect to the p-InP layer 13. Such wet etching is superior in simplicity to the step of re-growing the SI-InP layer 15a by virtue of the MOVPE method in the first embodiment.

However, in the optical semiconductor device in the present embodiment, the i-InP layer 12 and the p-InP layer 13 are formed uniformly in the portions of the optical waveguides 5, 6 in which the phase modulation electrodes 18a, 18b are not formed. Therefore, the energy loss of the high-frequency electric signal is caused by this portion.

Accordingly, the frequency band of the traveling-wave electrodes becomes low in contrast to the optical semiconductor device in the first embodiment in which such portion is made of the SI-InP layer. However, the p-InGaAs contact layer 14, which has the highest electric conductivity out of the p-type semiconductor layer, is removed from the portions in which the phase modulation electrodes 18a, 18b are not formed. Therefore, a difference in the energy loss from that in the optical semiconductor device in the first embodiment is small.

Also, the cross section of the phase modulator portion is the same as the cross section shown in FIG. 7, and has the structure that a width of the i-MQW layer 11 is narrowed. Therefore, such an advantage can be achieved that the energy loss of the high-frequency electric signal is reduced rather than the prior art.

As described above, according to the present invention, respective undoped core layers and the upper clad layers in two optical waveguides are formed separately mutually. Therefore, even if the core layers become conductive by the dopant contained in the upper clad layers, it can be prevented that two optical waveguides are connected electrically via the core layers and the upper clad layers.

Also, since the core layer and the upper clad layer are set to almost the optical mode distribution, the overlapping of the upper clad layer with the electric field of the high-frequency electric signal can be reduced and thus the loss of the high-frequency electric signal can be almost eliminated. In addition, since the uppermost surface of the semiconductor layers that are present between respective core layers of two optical waveguides is set lower than the core layer, the high-frequency electric signal that is applied to the phase modulation signal over respective core layers does not overlap with the conductive semiconductor in the area between the core layers. Therefore, the loss of the high-frequency electric signal can be reduced in this area.

Further, in two optical waveguides, the second conductivity type semiconductor layer is formed on the core layers under the phase modulation electrodes, and the high-resistance semiconductor layer is formed on the core layers in remaining areas. Therefore, the energy loss of the high-frequency electric signal in the areas other than the phase modulation electrodes can be extremely reduced.

What is claimed is:

1. An optical semiconductor device comprising:
   a bias layer formed on a semiconductor substrate and made of a first conductivity type semiconductor;
   a first optical waveguide formed on the bias layer, and having a stripe-like first core layer that is put between a first upper clad layer and a first lower clad layer made of the first conductivity type semiconductor;
   a second optical waveguide formed on the bias layer to be put between a second upper clad layer, which is separated from the first upper clad layer, and a second lower clad layer made of the first conductivity type semiconductor, and having a stripe-like second core layer that is formed separately from the first core layer;
   a first phase modulation electrode formed on the first upper clad layer of the first optical waveguide;
   a second phase modulation electrode formed on the second upper clad layer of the second optical waveguide;
   a first slot-line electrode formed on a side of the first optical waveguide and connected to the first phase modulation electrode via a first air-bridge wiring;
   a second slot-line electrode formed on a side of the second optical waveguide and connected to the second phase modulation electrode via a second air-bridge wiring;
   a first optical coupler formed over the semiconductor substrate and connected to respective one ends of the first optical waveguide and the second optical waveguide; and
   a second optical coupler formed over the semiconductor substrate and connected to respective other ends of the first optical waveguide and the second optical waveguide.

2. An optical semiconductor device according to claim 1, wherein a bias electrode to which a direct current is applied is formed on a part of the bias layer.

3. An optical semiconductor device according to claim 1, wherein respective surfaces of the first upper clad layer and the first lower clad layer, which come into contact with the first core layer, have a substantially same width as the first core layer, and
   respective surfaces of the second upper clad layer and the second lower clad layer, which come into contact with the second core layer, have a substantially same width as the second core layer.

4. An optical semiconductor device according to claim 1, further comprising:
   a high-resistance semiconductor layer formed on both sides of the first core layer to contact to the first core layer and connected to the first phase modulation electrode via an upper surface, and formed on both sides of the second core layer to contact to the second core layer and connected to the second phase modulation electrode via the upper surface.

5. An optical semiconductor device according to claim 4, wherein a recess whose depth is shallower than the first core layer and the second core layer is formed in the high-resistance semiconductor layer in an area between the first core layer and the second core layer.

6. An optical semiconductor device according to claim 1, wherein the first phase modulation electrode and the second phase modulation electrode are formed in plural at an interval in a light traveling direction respectively.

7. An optical semiconductor device according to claim 6, wherein the first upper clad layer is formed of a second conductivity type semiconductor under the first phase modulation electrode and is formed of the high-resistance semiconductor layer in areas except an area located under the first phase modulation electrode, and
   the second upper clad layer is formed of the second conductivity type semiconductor under the second phase modulation electrode and is formed of the high-resistance semiconductor layer in areas except an area located under the second phase modulation electrode.

8. An optical semiconductor device according to claim 1, wherein the first upper clad layer and the second upper clad layer are formed of the second conductivity type semiconductor respectively.

9. An optical semiconductor device according to claim 1, wherein a core layer of a third optical waveguide is formed in the first optical coupler on an opposite side to the first core layer and the second core layer to put the first optical coupler therebetween,
   a core layer of a fourth optical waveguide is formed in the second optical coupler on an opposite side to the first core layer and the second core layer to put the second optical coupler therebetween, and a semiconductor laser having an active layer, which is butt-jointed to an end portion of at least one of core layers of the third optical waveguide and the fourth optical waveguide, is formed on the semiconductor substrate.

10. An optical semiconductor device according to claim 9, wherein the first upper clad layer and the second upper clad layer under the first phase modulation electrode and the second phase modulation electrode are formed of the second conductivity semiconductor, and a second conductivity type clad layer, which is isolated substantially from the second conductivity type clad layer via the high-resistance semiconductor layer, is formed over the active layer of the semiconductor laser.

11. An optical semiconductor device according to claim 9, further comprising:

a first conductivity type semiconductor layer formed under the first lower clad layer, the second lower clad layer, and the active layer; and an electrode formed on a part of the first conductivity type semiconductor layer to apply a DC bias voltage to the first conductivity type semiconductor layer.

12. An optical semiconductor device according to claim 1, further comprising:

a phase-difference adjusting electrode formed over the core layer in areas, which are remote from the first phase modulation electrode and the second phase modulation electrode, to apply an electric field to at least one core layer of the first core layer and the second core layer.

13. An optical semiconductor device according to claim 12, wherein a high-resistance semiconductor layer is formed on the core layer in areas between the phase-difference adjusting electrode and the first phase modulation electrode and the second phase modulation electrode.

14. An optical semiconductor device according to claim 12, wherein the phase-difference adjusting electrode formed over the core layer and the first phase modulation electrode or the second phase modulation electrode are connected electrically.

15. An optical semiconductor device according to claim 12, wherein a bias voltage source for applying a DC bias voltage, by which an optical output power in an ON state of a light and an extinction ratio are maximized substantially, is connected to the phase-difference adjusting electrode.

16. An optical semiconductor device according to claim 12, wherein the phase-difference adjusting electrode is formed over both the first core layer and the second core layer respectively, and a DC bias voltage that is in a range to maximize substantially an optical output power in an ON state of a light and an extinction ratio at a time of optical modulation operation and reduce a potential difference between two phase-difference adjusting electrodes is applied separately to the two phase-difference adjusting electrodes from a bias voltage source.

17. An optical semiconductor device according to claim 16, wherein a high-frequency electric signal source is connected between two phase-difference adjusting electrodes, and an electric filter for cutting off a DC component is inserted between the high-frequency electric signal source and at least one of the two phase-difference adjusting electrodes.

18. An optical semiconductor device according to claim 1, wherein the first upper clad layer and the second upper clad layer are formed of the second conductivity type semiconductor, and at least a part of the first upper clad layer and the second upper clad layer is removed from areas in which the first phase modulation electrode and the second phase modulation electrode are not formed.

19. An optical semiconductor device comprising:

a bias layer formed on a semiconductor substrate and made of first conductivity type semiconductor;

a first optical waveguide formed on the bias layer, and having a stripe-like first core layer that is put between a first upper clad layer and a first lower clad layer made of the first conductivity type semiconductor and has a width equal to a beam diameter in an electric field distribution in a propagation basic mode of optical waveguides;

a second optical waveguide formed on the bias layer to be put between a second upper clad layer, which is separated from the first upper clad layer, and a second lower clad layer made of the first conductivity type semiconductor, and having a stripe-like second core layer that has a width equal to the beam diameter in the electric field distribution in the propagation basic mode of the optical waveguides;

a first phase modulation electrode formed on the first upper clad layer of the first optical waveguide;

a second phase modulation electrode formed on the second upper clad layer of the second optical waveguide;

a first slot-line electrode formed on a side of the first optical waveguide and connected to the first phase modulation electrode via a first air-bridge wiring;

a second slot-line electrode formed on a side of the second optical waveguide and connected to the second phase modulation electrode via a second air-bridge wiring;

a first optical coupler formed over the semiconductor substrate and connected to respective one ends of the first optical waveguide and the second optical waveguide; and a second optical coupler formed over the semiconductor substrate and connected to respective other ends of the first optical waveguide and the second optical waveguide.

20. An optical semiconductor device according to claim 19, wherein a bias electrode to which a direct current is applied is formed on a part of the bias layer.

21. An optical semiconductor device according to claim 19, wherein respective surfaces of the first upper clad layer and the first lower clad layer, which come into contact with the first core layer, have a substantially same width as the first core layer, and respective surfaces of the second upper clad layer and the second lower clad layer, which come into contact with the second core layer, have a substantially same width as the second core layer.

22. An optical semiconductor device according to claim 19, further comprising:

a high-resistance semiconductor layer formed on both sides of the first core layer to contact to the first core layer and connected to the first phase modulation electrode via an upper surface, and formed on both sides of the second core layer to contact to the second core layer and connected to the second phase modulation electrode via the upper surface.

23. An optical semiconductor device according to claim 22, wherein a recess whose depth is shallower than the first core layer and the second core layer is formed in the high-resistance semiconductor layer in an area between the first core layer and the second core layer.

24. An optical semiconductor device according to claim 19, wherein the first phase modulation electrode and the second phase modulation electrode are formed in plural at an interval in a light traveling direction respectively.

25. An optical semiconductor device according to claim 24, wherein the first upper clad layer is formed of a second conductivity type semiconductor under the first phase modulation electrode and is formed of the high-resistance semiconductor layer in areas except an area located under the first phase modulation electrode, and the second upper clad layer is formed of the second conductivity type semiconductor under the second phase modulation electrode and is formed of the high-resistance semiconductor layer in areas except an area located under the second phase modulation electrode.

26. An optical semiconductor device according to claim 19, wherein the first upper clad layer and the second upper clad layer are formed of the second conductivity type semiconductor respectively.

27. An optical semiconductor device according to claim 19, wherein a core layer of a third optical waveguide is formed in the first optical coupler on an opposite side to the first core layer and the second core layer to put the first optical coupler therebetween, a core layer of a fourth optical waveguide is formed in the second optical coupler on an opposite side to the first core layer and the second core layer to put the second optical coupler therebetween, and a semiconductor laser having an active layer, which is butt-jointed to an end portion of at least one of core layers of the third optical waveguide and the fourth optical waveguide, is formed on the semiconductor substrate.

28. An optical semiconductor device according to claim 27, wherein the first upper clad layer and the second upper clad layer under the first phase modulation electrode and the second phase modulation electrode are formed of the second conductivity semiconductor, and a second conductivity type clad layer, which is isolated substantially from the second conductivity type clad layer via the high-resistance semiconductor layer, is formed over the active layer of the semiconductor laser.

29. An optical semiconductor device according to claim 27, further comprising:

a first conductivity type semiconductor layer formed under the first lower clad layer, the second lower clad layer, and the active layer; and an electrode formed on a part of the first conductivity type semiconductor layer to apply a DC bias voltage to the first conductivity type semiconductor layer.

30. An optical semiconductor device according to claim 19, further comprising:

a phase-difference adjusting electrode formed over the core layer in areas, which are remote from the first phase modulation electrode and the second phase modulation electrode, to apply an electric field to at least one core layer of the first core layer and the second core layer.

31. An optical semiconductor device according to claim 30, wherein a high-resistance semiconductor layer is formed on the core layer in areas between the phase-difference adjusting electrode and the first phase modulation electrode and the second phase modulation electrode.

32. An optical semiconductor device according to claim 30, wherein the phase-difference adjusting electrode formed over the core layer and the first phase modulation electrode or the second phase modulation electrode are connected electrically.

33. An optical semiconductor device according to claim 30, wherein a bias voltage source for applying a DC bias voltage, by which an optical output power in an ON state of a light and an extinction ratio are maximized substantially, is connected to the phase-difference adjusting electrode.

34. An optical semiconductor device according to claim 30, wherein the phase-difference adjusting electrode is formed over both the first core layer and the second core layer respectively, and a DC bias voltage that is in a range to maximize substantially an optical output power in an ON state of a light and an extinction ratio at a time of optical modulation operation and reduce a potential difference between two phase-difference adjusting electrodes is applied separately to the two phase-difference adjusting electrodes from a bias voltage source.

35. An optical semiconductor device according to claim 34, wherein a high-frequency electric signal source is connected between two phase-difference adjusting electrodes, and an electric filter for cutting off a DC component is inserted between the high-frequency electric signal source and at least one of the two phase-difference adjusting electrodes.

36. An optical semiconductor device according to claim 19, wherein the first upper clad layer and the second upper clad layer are formed of the second conductivity type semiconductor, and at least a part of the first upper clad layer and the second upper clad layer is removed from areas in which the first phase modulation electrode and the second phase modulation electrode are not formed.

\* \* \* \* \*